United States Patent
Losinno et al.

(10) Patent No.: US 10,802,059 B2
(45) Date of Patent: Oct. 13, 2020

(54) POWER SENSOR AND METHOD FOR DETERMINING POWER USE OF AN ASSOCIATED APPLIANCE

(71) Applicant: Dius Computing Pty Ltd, Melbourne, VIC (AU)

(72) Inventors: Joe Losinno, Melbourne (AU); Bernd Meyer, Melbourne (AU); Zoran Angelovski, Melbourne (AU); Johny Mattsson, Melbourne (AU)

(73) Assignee: Dius Computing Pty Ltd, Melbourne, VIC (AU)

( * ) Notice: Subject to any disclaimer, the term of this patent is extended or adjusted under 35 U.S.C. 154(b) by 86 days.

(21) Appl. No.: 16/083,833

(22) PCT Filed: Mar. 10, 2017

(86) PCT No.: PCT/AU2017/050222
§ 371 (c)(1),
(2) Date: Sep. 10, 2018

(87) PCT Pub. No.: WO2017/152243
PCT Pub. Date: Sep. 14, 2017

(65) Prior Publication Data
US 2019/0079122 A1    Mar. 14, 2019

(30) Foreign Application Priority Data
Mar. 11, 2016   (AU) ................................. 2016900912

(51) Int. Cl.
*G01R 21/08* (2006.01)
*G01R 15/20* (2006.01)
(Continued)

(52) U.S. Cl.
CPC ............. *G01R 21/08* (2013.01); *G01R 15/20* (2013.01); *G01R 33/0206* (2013.01); *G01R 21/133* (2013.01)

(58) Field of Classification Search
CPC ..... G01R 21/08; G01R 33/0206; G01R 15/20
See application file for complete search history.

(56) References Cited

U.S. PATENT DOCUMENTS

| 5,296,802 A |   | 3/1994 | Beranger et al. |
| 5,530,364 A | * | 6/1996 | Mashikian ........... G01R 31/083 324/242 |

(Continued)

FOREIGN PATENT DOCUMENTS

| EP | 2278344 A2 | 1/2011 |
| EP | 2 439 544 A2 | 4/2012 |

(Continued)

OTHER PUBLICATIONS

Jose Antonio De La O Serna, "Synchrophasor Measurement With Polynomial Phase-Locked-Loop Taylor-Fourier Filters", IEEE Transactions on Instrumentation and Measurement, vol. 64, No. 2, Feb. 2015, pp. 328-337, title, abstract, p. 328 col. 1, paragraph 1 of the 'Introduction', col. 2 paragraphs 2, 3, p. 333, paragraphs 2,3: Figs 2,3.

(Continued)

*Primary Examiner* — Dominic E Hawkins
(74) *Attorney, Agent, or Firm* — Kilpatrick Townsend & Stockton LLP

(57) ABSTRACT

Described embodiments generally relate to a method of determining power delivered by a cable, the method comprising receiving data related to a residual magnetic field produced by the cable; determining a proportionality factor relating the received data to the power delivered by comparing the residual magnetic field data to independently measured reference data related to the power delivered by (Continued)

the cable; and based on the proportionality factor, determining the power delivered by the cable.

40 Claims, 19 Drawing Sheets

(51) Int. Cl.
   *G01R 33/02* (2006.01)
   *G01R 21/133* (2006.01)

(56) References Cited

U.S. PATENT DOCUMENTS

| | | | |
|---|---|---|---|
| 2011/0037455 | A1 | 2/2011 | Oren et al. |
| 2012/0084027 | A1 | 4/2012 | Caine |
| 2012/0215469 | A1* | 8/2012 | Serra .................. G01R 27/2694 702/61 |
| 2012/0319674 | A1 | 12/2012 | El-Essawy et al. |
| 2014/0009146 | A1* | 1/2014 | Blagojevic ............. G01R 33/07 324/252 |
| 2014/0266177 | A1 | 9/2014 | Wisniewski et al. |
| 2015/0006941 | A1* | 1/2015 | King ...................... H02M 1/42 713/340 |
| 2015/0008911 | A1* | 1/2015 | Majer .................... G01R 15/20 324/234 |
| 2015/0168464 | A1* | 6/2015 | Yogeeswaran ......... G01R 33/07 324/126 |
| 2016/0012460 | A1* | 1/2016 | Kruglick ................ G01D 4/002 705/14.1 |
| 2017/0187091 | A1* | 6/2017 | Acker .................. H05B 6/6414 |

FOREIGN PATENT DOCUMENTS

| | | |
|---|---|---|
| EP | 2 618 166 A2 | 7/2013 |
| WO | 2016/028710 A1 | 2/2016 |
| WO | 2017/152243 A1 | 9/2017 |

OTHER PUBLICATIONS

International Search Report for PCT/AU2017/050222 dated Apr. 21, 2015, 6 pages.

Written Opinion for PCT/AU2017/050222 dated Apr. 21, 2015, 7 pages.

Written Opinion for PCT/AU2017/050222 dated Feb. 9, 2018, 4 pages.

International Preliminary Report on Patentability for PCT/AU2017/050222 dated Jul. 13, 2018, 31 pages.

Donnal John S et al.: "Noncontact Power Meter", IEEE Sensors Journal, IEEE Service Center, New York, NY, US, vol. 15, No. 2, Feb. 1, 2015, pp. 1161-1169, XP011566318, ISSN: 1530-437X, DOI: 10.1109/JSEN.2014.2359619 [retrieved on Dec. 2, 2014], the whole document.

Chen Yung-Chang et al.: "A Power Sensor Tag With Interference Reduction for Electricity Monitoring of Two-Wire Household Appliances", IEEE Transactions on Industrial Electronics, IEEE Service Center, Piscataway, NJ, USA, vol. 61, No. 4, Apr. 1, 2014, pp. 2062-2070, XP011531127, ISSN: 0278-0046, DOI: 10.1109/TIE.2013.2266089 [retrieved on Oct. 22, 2013].

European Search Report for EP 17762347 dated Nov. 5, 2019, 17 pages.

* cited by examiner

POWER SENSOR AND METHOD FOR DETERMINING POWER USE OF AN ASSOCIATED APPLIANCE

TECHNICAL FIELD

Described embodiments generally relate to energy monitoring. In particular, described embodiments are directed to systems, methods and devices for measuring energy consumption and generation.

BACKGROUND

Measuring power requires monitoring both voltage and current in a circuit. For measuring the power consumed or generated by appliances, this typically requires making direct electrical contact with a household mains supply and inserting a power meter between the supply and the load or appliance. This is a straightforward and effective way to measure power and there are many devices on the market that can be used to measure power in this way. However, there are several drawbacks to this approach. For example, an electrician may be required to install the power meter depending on the appliance, and the power meter must be placed in-line with the load circuit which may make the installation more complex. Also, the power meter circuit can be relatively complex, since it needs to measure both voltage and current. Furthermore, there is an added cost due to the need for components such as a current transformer, Rogowski coil or shunt resistor for current measurement.

It is desired to address or ameliorate one or more shortcomings or disadvantages associated with prior energy monitoring devices, or to at least provide a useful alternative thereto.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

Some embodiments relate to a method of measuring power delivered by a cable, the method comprising:
  receiving data related to the residual magnetic field produced by the cable;
  determining a proportionality factor relating the received data to the power delivered by comparing the residual magnetic field data to independently measured reference data related to the power delivered by the cable; and
  based on the proportionality factor, determining the power delivered by the cable;
  wherein the cable comprises at least two conductors.

The method may further comprise determining the proportionality factor by comparing the magnetic field data to estimated values of power delivered by the cable. The method may further comprise estimating values of power flow through the cable based on known power consumption data for a premises. The method may further comprise receiving known power consumption data for the premises from a smart meter monitoring the power consumption for the premises. The method may further comprise calculating a premises power value compensated for estimated power delivered by the cable. According to some embodiments, the cable is configured to deliver power from a solar power installation, and smart meter data during sunlight hours is compared to smart meter data during sundown hours to determine a premises power value compensated for estimated power delivered by the cable.

The method may further comprise estimating a noise level for a sensor from which the residual magnetic field data is received, and determining a standard deviation of the received residual magnetic field data. The method may further comprise selecting which residual magnetic field data values to use to determine the proportionality factor based on the relationship between the estimated noise level for the sensor and the standard deviation of the received residual magnetic field data. The method may further comprise compensating for the estimated noise level for the sensor when determining the proportionality factor.

According to some embodiments, the magnetic field data comprises a number of samples taken for a predetermined duration at a predetermined sample rate. According to some embodiments, the duration and the sample rate are determined based on the frequency of the power delivered by the cable, wherein the duration and the sample rate allow for samples to be taken during a plurality of periods of the power delivered by the cable.

The method may further comprise calculating a magnetic field strength based on the magnetic field data by multiplying the magnetic field data by a complex signal related to the frequency of the power delivered by the cable, determining a median field strength based on a set of magnetic field data, excluding outliers, and determining an average magnetic field strength.

Some embodiments relate to a device for measuring a residual magnetic field produced by an electrical cable, the device comprising:
  a magnetometer;
  a clamp for securing the magnetometer to an insulating outer layer of the cable;
  and a processor in communication with the magnetometer;
  wherein the magnetometer is configured to measure the residual current produced by the cable; and
  wherein the processor is configured to cause the magnetometer to take a number of samples for a predetermined duration at a predetermined sample rate; and to determine the duration and the sample rate based on the frequency of the power delivered by the cable, so that the duration and the sample rate allow for samples to be taken during a plurality of periods of the power delivered by the cable.

The device may further comprise a processor in communication with the magnetometer. The device may further comprise a communications module configured to communicate with an external device.

According to some embodiments, the processor is configured to cause the magnetometer to take a number of samples for a predetermined duration at a predetermined sample rate. According to some embodiments, the processor is configured to determine the duration and the sample rate based on the frequency of the power delivered by the cable, wherein the duration and the sample rate allow for samples to be taken during a plurality of periods of the power delivered by the cable. According to some embodiments, the processor is further configured to calculate a magnetic field strength based on the magnetic field data by multiplying the magnetic field data by a complex signal related to the frequency of the power delivered by the cable, determine a median field strength based on a set of magnetic field data, excluding outliers, and determine an average magnetic field strength.

Some embodiments relate to a system for determining the power delivered by one or more cables, the system comprising:
the device of some other embodiments; and
a server system comprising one or more processing devices.

According to some embodiments, the one or more processing devices within the server system are configured to perform the method of any some other embodiments.

The system may further comprise a smart meter. The system may further comprise an energy monitoring device configured to receive data from the smart meter and to communicate with the server system.

According to some embodiments, the server system is configured to make power data available to one or more external devices.

Some embodiments relate to a method of determining an amplitude and a phase of power delivered by a cable, the method comprising:
receiving data related to a residual magnetic field produced by the cable, wherein the data related to the residual magnetic field produced by the cable is temporally related to the phase of the power delivered by the cable;
determining a proportionality factor relating the received data to the power delivered by comparing the residual magnetic field data to independently measured reference data related to the power delivered by the cable; and
based on the proportionality factor, determining the amplitude and the phase of power delivered by a cable.

Some embodiments relate to a method of measuring power delivered by a cable, the method comprising:
receiving data related to a residual magnetic field produced by the cable;
receiving independently measured reference data related to the power delivered by the cable;
integrating the data related to the residual magnetic field produced by the cable into intervals corresponding to intervals at which the independently measured reference data related to the power delivered by the cable are received;
determining a proportionality factor relating the received data to the power delivered by comparing the residual magnetic field data to the independently measured reference data related to the power delivered by the cable; and
based on the proportionality factor, determining the power delivered by the cable;
wherein the cable comprises at least two conductors.

BRIEF DESCRIPTION OF DRAWINGS

Embodiments are described in further detail below, by way of example and with reference to the accompanying drawings, in which.

DETAILED DESCRIPTION

Described embodiments generally relate to energy monitoring. In particular, described embodiments are directed to systems, methods and devices for measuring energy consumption and generation.

Magnetometers are commonly used to measure current flowing through a conductor by detecting the induced magnetic field around the conductor. Applying this approach to measure current in a home environment has several drawbacks. Firstly, typical electrical wiring in the home contains two conductors (active and neutral) which have equal and opposing current flows which tend to cancel the magnetic field. Secondly, separating the active and neutral conductors in a power cord, multi-core cable or conduit in order to make a measurement on a single conductor is not practical. To overcome these difficulties, the present system uses the residual magnetic field generated by a current flowing through a conductor pair to obtain a measure of the current flowing through the conductors.

Figure 1:
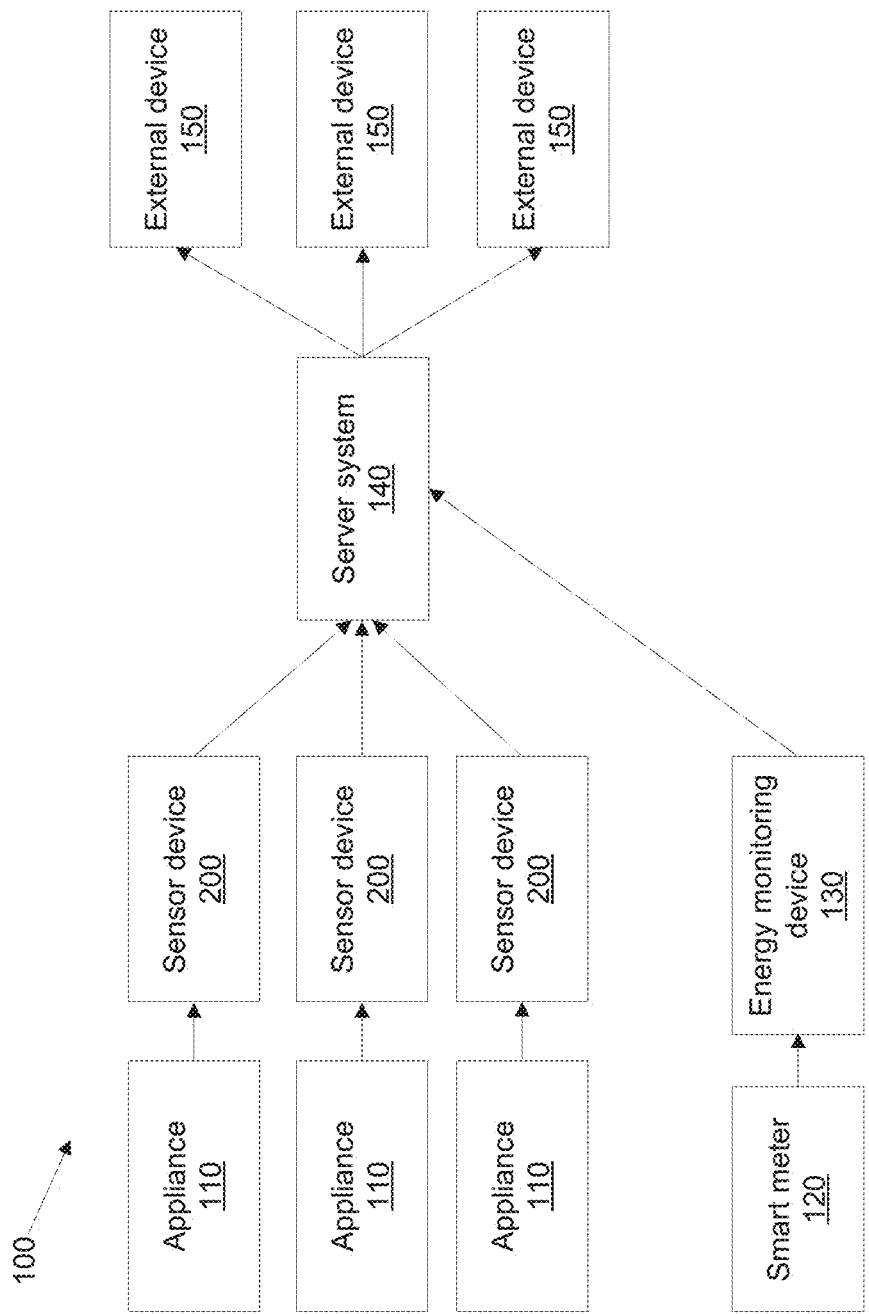
FIG. 1 shows a block diagram of a system for monitoring power generation and consumption according to some embodiments.

FIG. 1 shows an energy monitoring system 100 having a number of appliances 110, sensor devices 200, a smart meter 120, an energy monitoring system 130, a server system 140 and a number of external devices 150. Appliances 110 may include household appliances such as refrigerators, televisions, washers, dryers, air conditioners and heaters, as well as energy generation devices such as solar panel systems. In some embodiments, appliances 110 may be powered by an AC mains voltage, which may be around 50 Hz, 60 Hz, or another frequency in some embodiments. It is to be understood that any specific examples in this document that refer to a specific AC mains frequency, such as 50 Hz, are not limited to that frequency, and that that frequency is only used as an illustrative example. According to some embodiments, the appliances may be powered by another AC signal, such as a signal from a solar power system or a generator. For the purposes of this document, the term "mains power" will be used to describe grid power as well as these alternative AC power sources. Each appliance 110 may be associated with a sensor device 200, which may be used to measure the electrical power used and/or generated by appliance 110. Sensor devices 200 are described in further detail below, with reference to FIG. 2.

Sensor devices 200 communicate with a server system 140. Server system 140 may include one or more servers, databases, and/or processing devices in communication over a network. In some embodiments, server system 140 may be a cloud computing system, such as the Intelligent.li cloud computing system.

Smart meter 120 may be an electronic meter that monitors, records and communicates the consumption and generation of electrical energy in relation to a particular premises, household, building or area. Smart meter 120 may sample instantaneous power usage at a rate of around once every 10 to 15 seconds in some embodiments. Smart meter 120 may be in communication with an energy monitoring device 130, which may be a Power VU Gateway device by DiUS Computing Pty Ltd in some embodiments. Server system 140 may make data available for presentation purposes through external devices 150, which may include desktop computers, laptop computers, smart phones, tablets, and/or other computing devices.

System 100 may be configured to monitor energy consumed and generated by appliances 110, and to make this information available through externals devices 150, based on energy levels determined by data produced by sensor devices 200 and smart meter 120. The data may be processed by a transformation engine within server system 140 to produce accurate power and energy data.

The energy data derived from sensor devices 200 and energy monitoring device 130 may include instantaneous or live power (measured in Watts), energy consumption (measured in kWhr), and energy consumption and generation for homes with solar (measured in kWhr) including gross solar energy, net energy and household energy consumption.

According to some embodiments, server system 140 may be configured to calibrate the output of sensor 200, and thereby provide accurate power measurements at an appliance level. This is unlike traditional voltage and current sensors, where power consumption or generation is measured directly. Instead, server system 140 may leverage billing grade data from smart meter 120 by correlating the measurement from sensor device 200 with the measurement from smart meter 120. Energy monitoring system 130 may poll smart meter 120 at regular intervals, buffer the data and push the data to server system 140 at regular intervals. Server system 140 may combine this data with data from sensor device 200 to provide an accurate power measurement.

Figure 2:
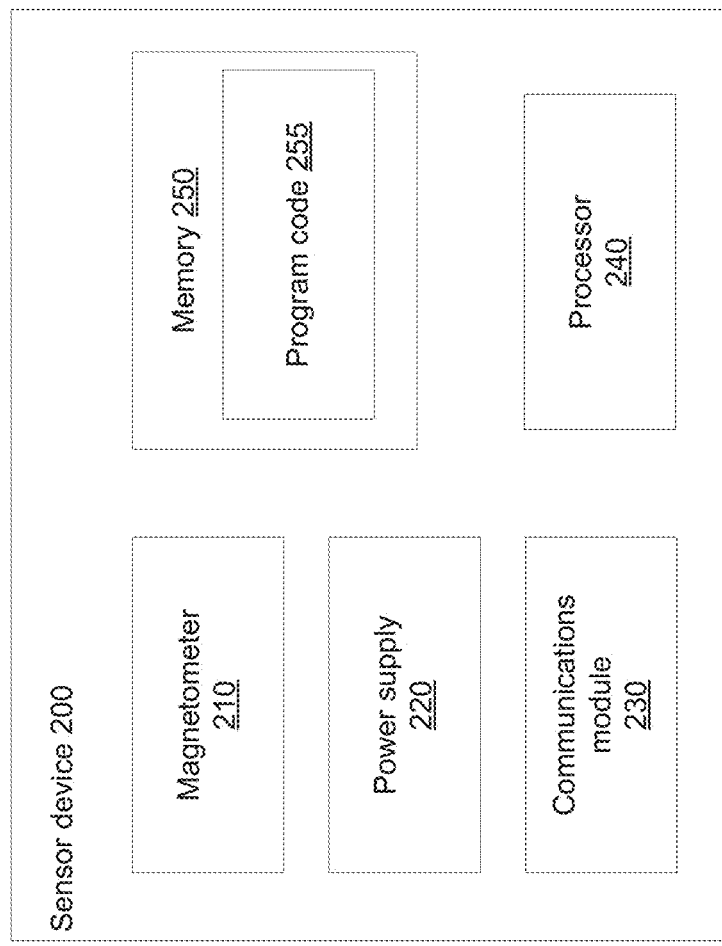
FIG. 2 shows a block diagram of a sensor device that may form part of FIG. 1 according to some embodiments.

FIG. 2 shows a sensor device 200 in more detail. Sensor device 200 may be configured to determine a measurement corresponding to the AC current which is flowing through a standard two or three conductor AC cable electrically connected to an appliance 110 by measuring the residual magnetic field produced by the cable. The measurement determined by sensor device 200 can then be used along with data from smart meter 120 to calculate the current and power transferred through the cable. Sensor device 200 may include a magnetometer 210, a power supply 220, a communications module 230, a processor 240 and memory 250.

Sensor 200 may be configured to be clamped around the outer insulation of the power cord or AC cable of an appliance 110. This attachment method means that the operation of sensor device 200 does not rely on making electrical contact with the household supply, making the operation of sensor device 200 safer than the operation of typical power sensing devices. This further makes sensor device 200 easy to install, as it does not require the AC cable to be spliced or even disconnected, as would be required if a current transformer or in-line power meters were to be used. This makes it possible to deploy sensor device 200 on AC cables which cannot be physically interfered with, such as those of electric ovens, large air conditioners or solar installations.

Magnetometer 210 may be configured to measure the magnetic field produced by the power cord or cable around which sensor device 200 is clamped. Magnetometer 210 may communicate this data to processor 240. Sensor device 200 may be powered by a power supply 220, which may include at least one battery in some embodiments. According to some embodiments, sensor device 200 may be configured to be able to be battery-powered for extended periods of time, such as for 4, 5, 6, 7, 8, 9, 10 or more months. This makes it possible to deploy sensor device 200 in locations where no ready source of mains power is available, such as in outdoor areas near a solar inverter, for example. Communications module 230 may receive data from processor 240, and communicate data to and/or receive data from one or more external server networks, which may include server system 140 in some embodiments.

Processor 240 may include one or more data processors for executing instructions, and may include one or more of a microcontroller-based platform, a suitable integrated circuit, and one or more application-specific integrated circuits (ASIC's). Processor 240 may include an arithmetic logic unit (ALU) for mathematical and/or logical execution of instructions, such operations performed on the data stored in internal registers of processor 240.

Processor 240 may have access to memory 250. Memory 250 may include one or more memory storage locations, which may be in the form of ROM, RAM, flash, or other memory types. Memory 250 may store program code 255, which may be executable by processor 240 to cause processor 240 to communicate with magnetometer 210 and communications module 230, and perform functions as described with further detail below.

When a current flows through a conductor, a circular magnetic field is induced in the plane perpendicular to the conductor. The strength of this magnetic field is proportional to the amount of current flowing, and diminishes linearly with distance from the conductor. For an AC current, the field reverses direction at the same time as the current reverses direction. Thus, measuring the strength of the reversing magnetic field provides a means to measure the amount of current.

This is the principle behind the common Current Transformer ("CT Clamp"), which completely encircles one conductor with a magnetically conductive material. This in effect integrates the magnetic field across the path of the encirclement, and as a result a total magnetic field is induced in the clamp that is directly proportional to the current in the conductor, independent of the relative location of CT Clamp and conductor. For AC conductors, this magnetic field can be measured by winding a (secondary) conductor around the magnetically conductive material, creating a transformer. For standard AC sources, the current induced in this secondary winding is directly proportional to the current flowing through the original conductor.

However, because the strength of field in the CT Clamp is independent of the location of the conductor relative to the clamp, encircling two conductors carrying equal but opposite current (as is the case in a standard AC cable) results in two equal but opposite magnetic fields being induced, which exactly cancel each other out. The resulting net field is zero. For this reason, CT Clamps can only be used when access to a single conductor is possible.

Figure 3:
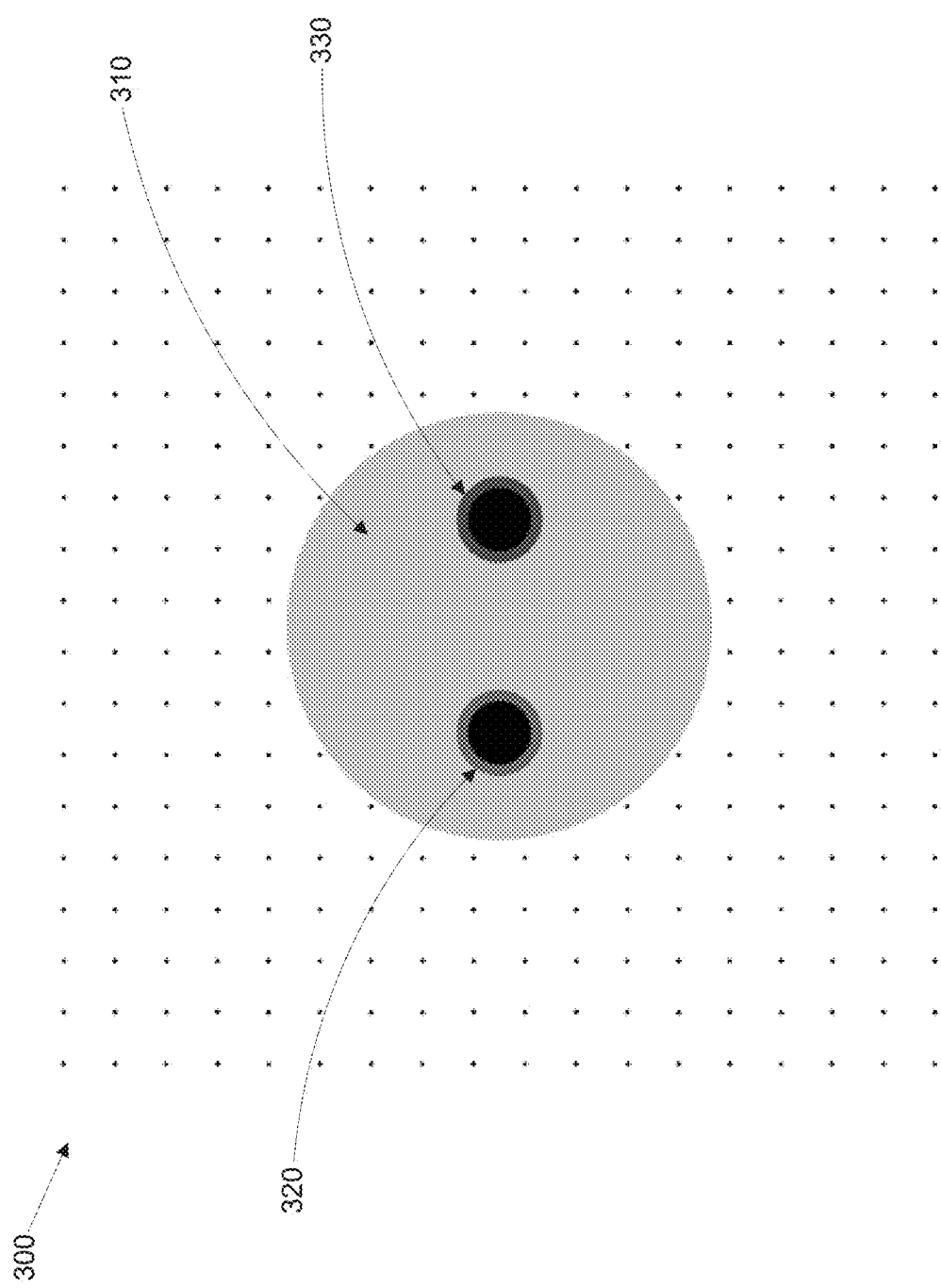
FIG. 3 shows a cross section of a two-conductor cable.
Figure 4:
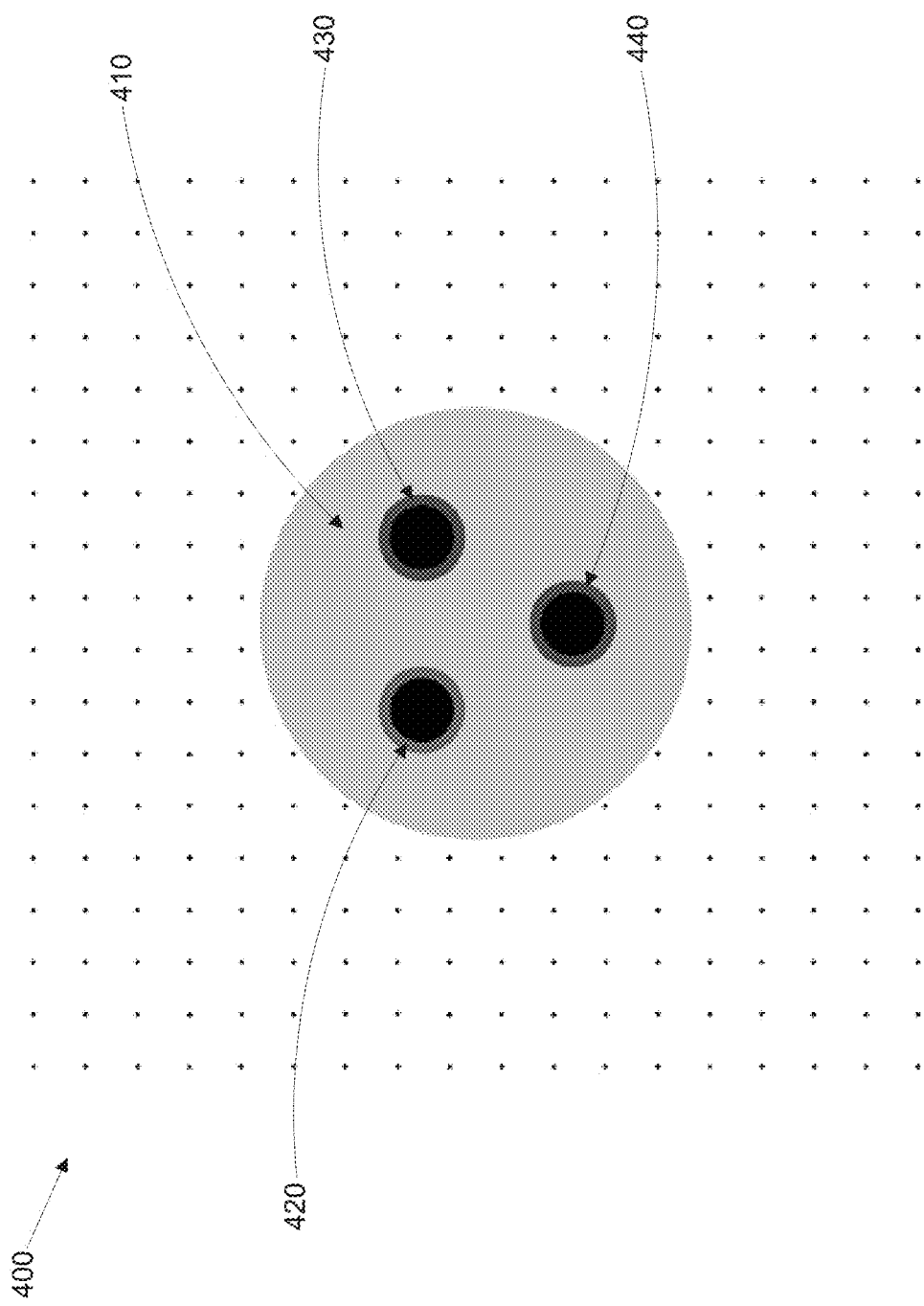
FIG. 4 shows a cross section of a three-conductor cable.

In common two or three conductor AC cables, individually insulated conductors for Active ("A"), Neutral ("N") and optionally Earth ("E") are placed next to each other, and encased in a second layer of insulator, which provides both additional insulation and structural integrity to the cable. FIG. 3 shows a cross-section 300 of a typical two conductor cable 310 having an Active conductor 320 and a Neutral conductor 330, and FIG. 4 shows a cross-section 400 of a typical three conductor cable 410 having an Active conductor 420, a Neutral conductor 430 and an Earth conductor 440.

During normal operation, the current in Active conductors 320/420 and Neutral conductors 330/430 are equal but opposite in direction. Any current in Earth conductor 440 is generally a sign of a dangerous malfunction, and in modern installations will trigger a Residual Current Device ("RCD"). Based on this, it is reasonable to assume zero current through Earth Conductor 440.

Figure 5:
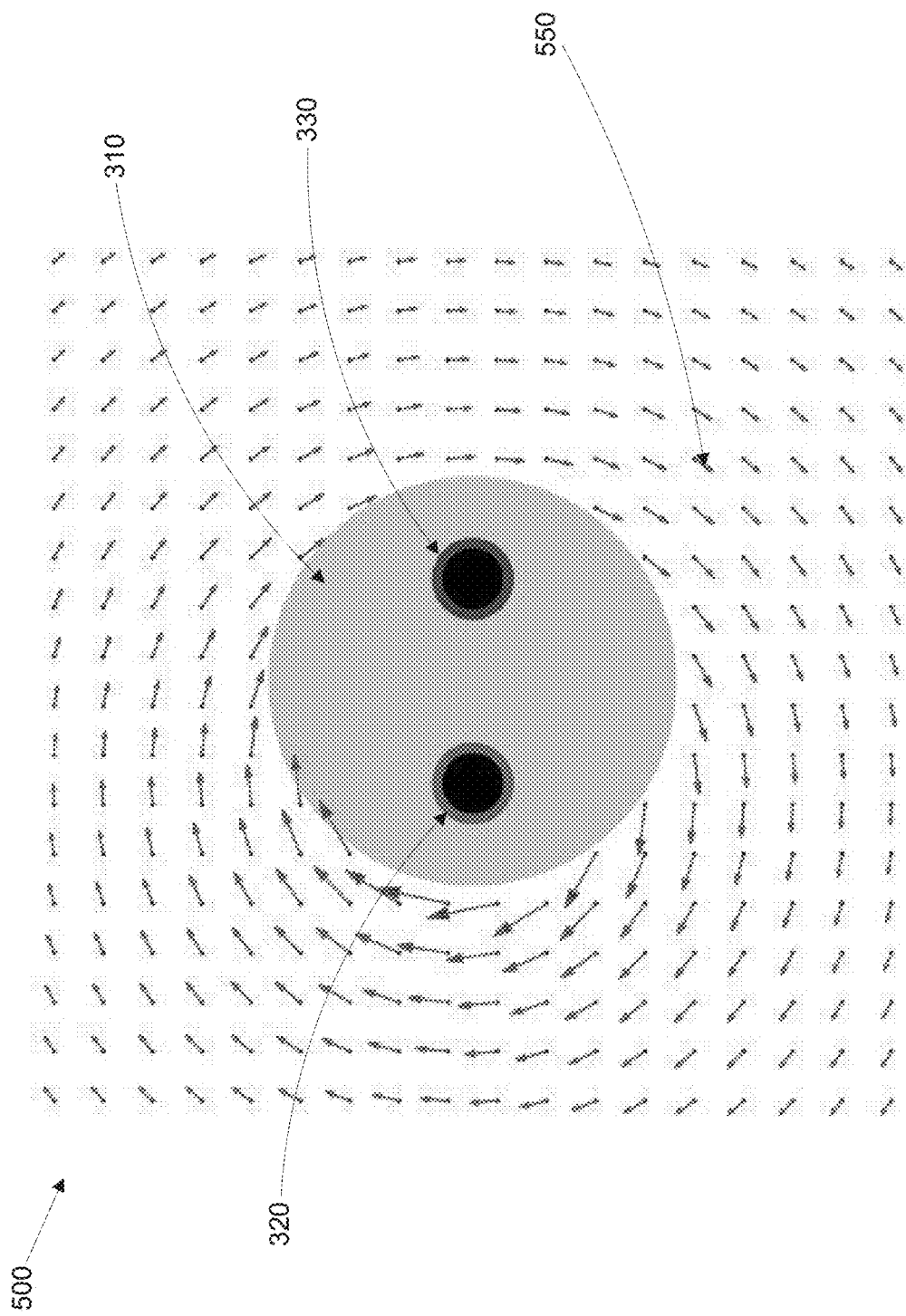
FIG. 5 shows a cross section of a two-conductor cable showing the magnetic field around the Active conductor.
Figure 6:
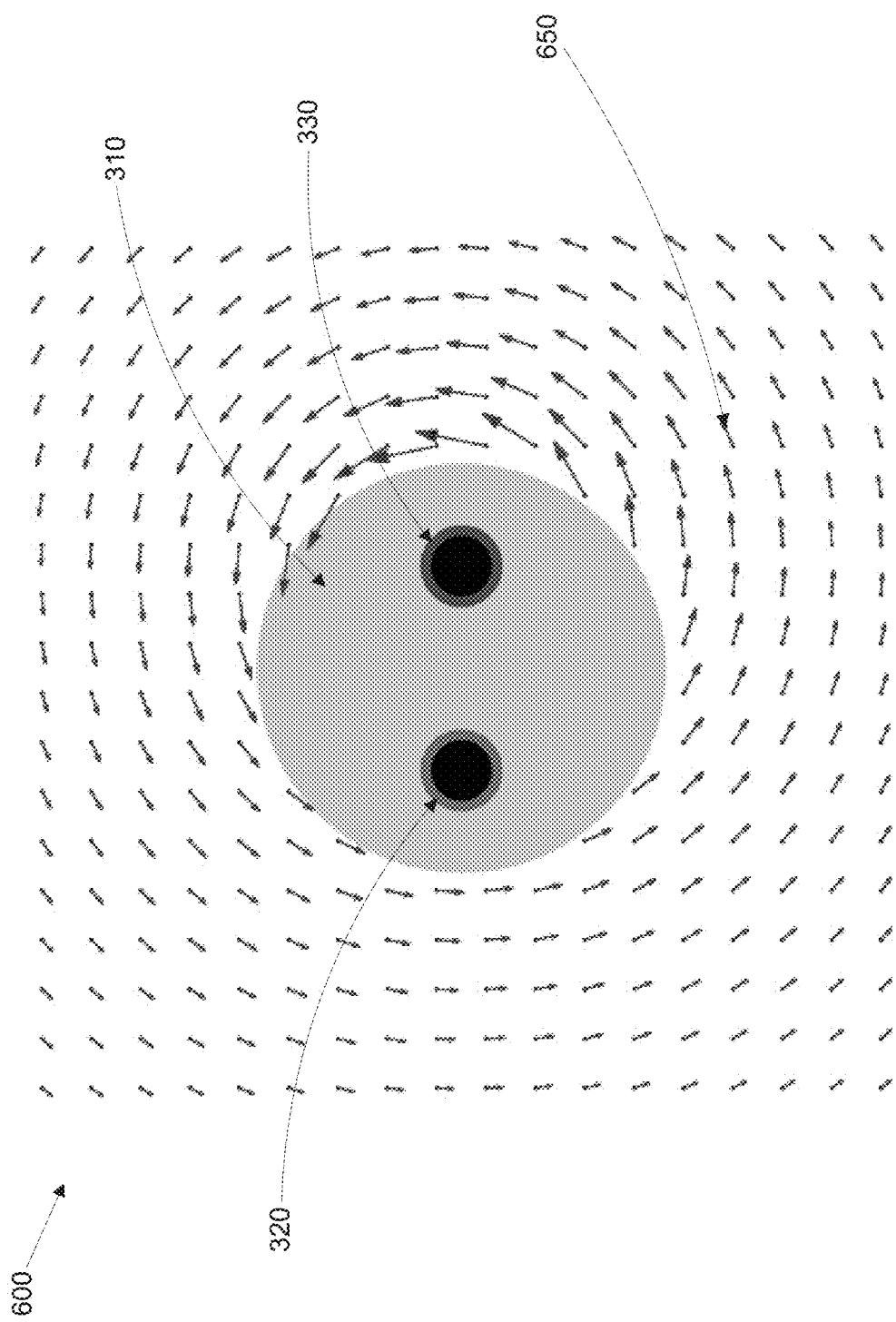
FIG. 6 shows a cross section of a two-conductor cable showing the magnetic field around the Neutral conductor.
Figure 7:
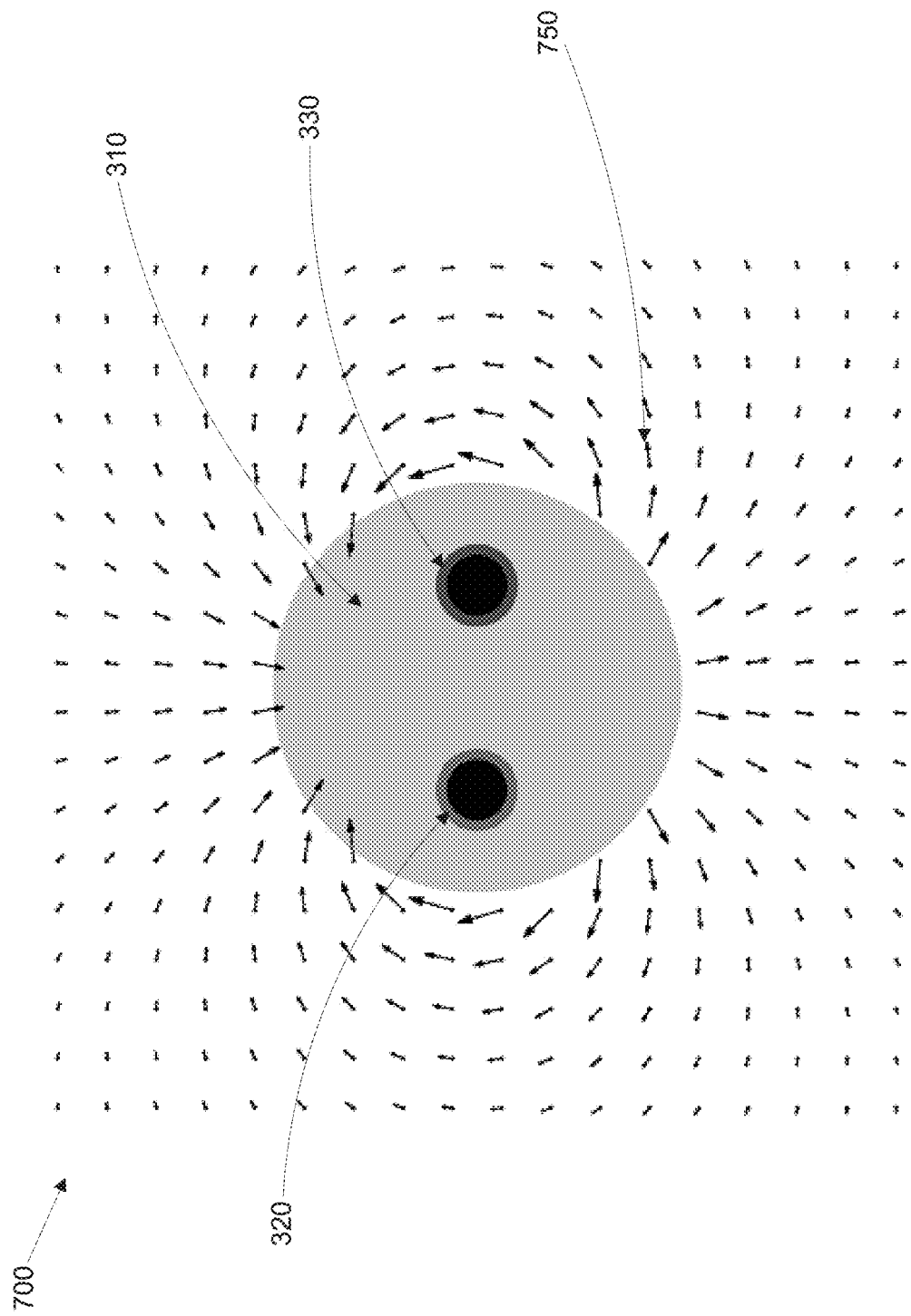
FIG. 7 shows a cross section of a two-conductor cable showing the residual magnetic field.
Figure 8:
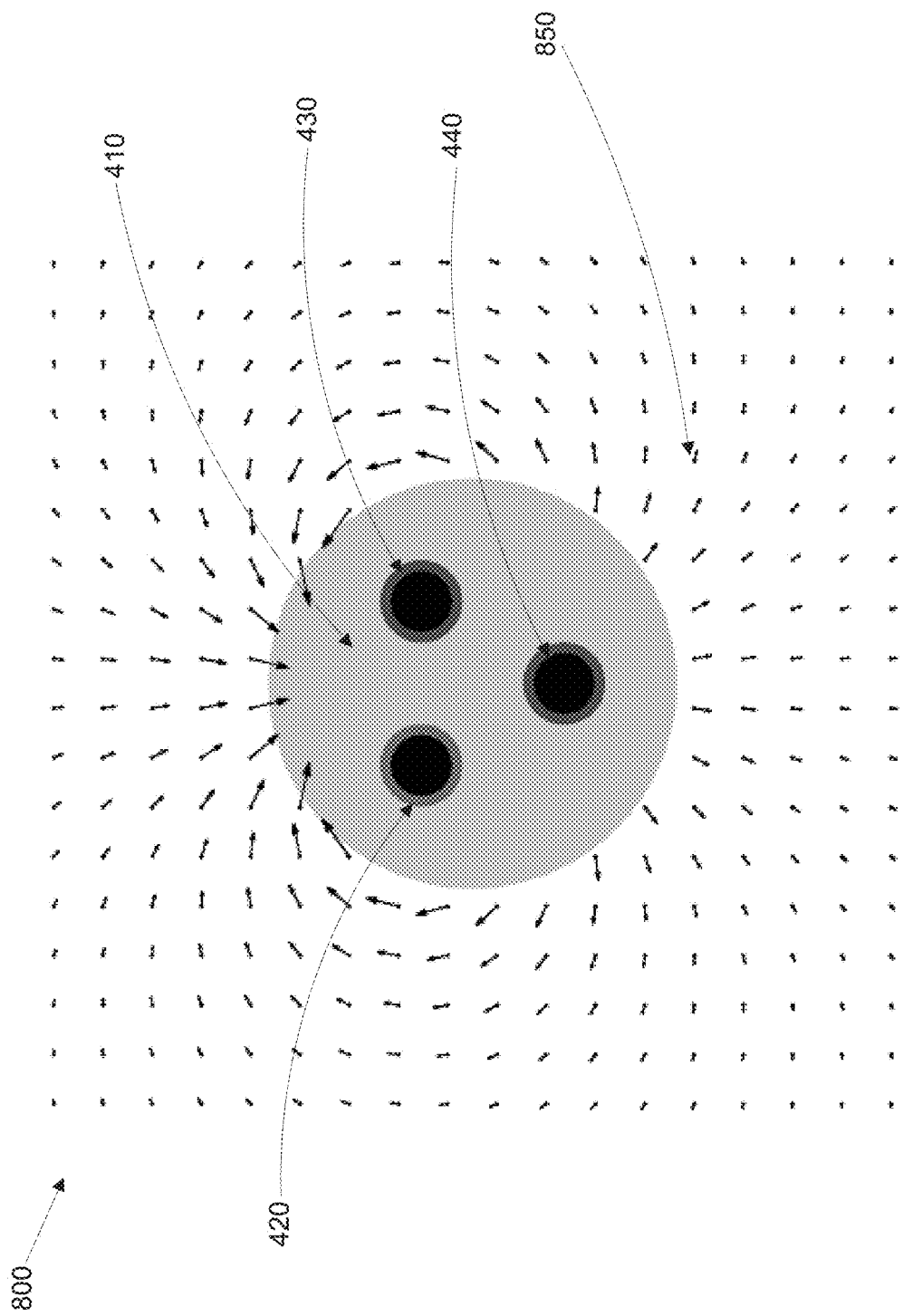
FIG. 8 shows a cross section of a three-conductor cable showing the residual magnetic field.

While integrating the magnetic field along a path encircling both Active conductor 320/420 and Neutral conductor 330/430 will always result in a net field of zero, this does not mean that the sum of magnetic fields from the two conductors is zero in any given place. FIG. 5 is a cross section 500 illustrating the Active field 550 for two-conductor cable 310, and FIG. 6 is a cross section 600 illustrating the Neutral field 650 for two-conductor cable 310. Comparing FIG. 5 to FIG. 6, it is apparent that field 550 is not the exact opposite of field 650, due to the difference in the position of Active conductor 320 to Neutral conductor 330 in cable 310. This is further illustrated in FIG. 7, which shows a cross section 700 illustrating the residual field 750 of the addition of Active field 550 with Neutral field 650, and FIG. 8, which shows a cross section 800 illustrating the residual field 850 of the addition of an Active field with a Neutral field of three-conductor cable 410.

A significant residual field 750/850 exists at the surface of cables 310 and 410, which rapidly diminishes with distance away from cables 310 and 410, roughly proportional to the square of the distance away from the cable 310/410. While the direction and exact strength of residual field 750/850 at any point on the surface of cable 310/410 is dependent on the relative geometry of that point and conductors 320/420 and 330/430, there are in fact no points in which residual field 750/850 is zero, or even vanishingly small. Thus, a direct measurement in any particular single point on or near the surface of cable 310/410 will observe a significant residual field 750/850. The strength of residual field 750/850 is proportional to the amount of current flowing through conductors 320/420 and 330/430, even though the proportionality factor and the direction of field 750/850 vary from point to point.

Recent advances in micro-electromechanical systems (MEMS) and hall effect magnetic sensor technology, driven by the inclusion of magnetometers in commodity smart phones, have resulted in high performance, low cost miniaturized magnetometers becoming readily available. Sensor device 200 includes such a magnetometer 210, configured to be positioned directly adjacent to the cable 310/410 in which current is to be measured when sensor device 200 is clamped to the cable. As detailed above, in that location, magnetometer 210 will experience a residual magnetic field 750/850 in the plane perpendicular to cable 310/410. Given a mains AC cable, this field will oscillate at the mains frequency (e.g. 50 Hz in Australia), and will be proportional in strength to the current flowing through the cable.

In the following examples, a mains frequency of 50 Hz will be assumed, but it is understood that the mains frequency may vary in some cases, and may be 60 Hz or another frequency. The calculations described can easily be adjusted to account for an alternative frequency other than 50 Hz if required.

Magnetometer 210 will also be affected by the Earth's magnetic field, and possibly by magnetic fields from permanent magnets (e.g. from magnetic toys, or from motors) and electromagnets (e.g. from speakers or magnetic door locks) in the vicinity of magnetometer 210. In most cases, these additional fields would not oscillate at or near the mains frequency.

Commodity magnetometers typically measure in three axes. For the purpose of sensor device 200, magnetometer 210 is arranged to be positioned so that the magnetic field is measured along the longitudinal axis of the cable, and along the plane perpendicular to the longitudinal axis of the cable.

For a purely resistive load, connected to a pure sine wave mains voltage, the current through the load is described by a perfect sine wave, at the same frequency as (and in phase with) the mains voltage. Based on this, for a mains frequency of 50 Hz, it would be sufficient to sample the magnetic field at no less than 100 Hz to determine the strength of the oscillating field.

However, many modern loads are far from being purely resistive. The prime example are switch mode power supplies, which tend to draw close to zero current through most of each period of AC voltage, and just short, large surges near the voltage peaks. In the frequency domain, this results in very significant current components at the odd harmonics (e.g. for a mains frequency of 50 Hz, the odd harmonics are at 150 Hz, 250 Hz, etc.). In order to resolve and discount these higher-frequency components, a much higher rate of sampling is required.

MEMS magnetometers are readily available which can support sample rates of 800 to 1000 samples/second. This corresponds to 16 to 20 samples per period, which is not quite sufficient to resolve the harmonics from common switch mode supplies. As a result, the observed field at 50 Hz varies somewhat depending on the phase alignment between sample points and the mains period.

Figure 9:
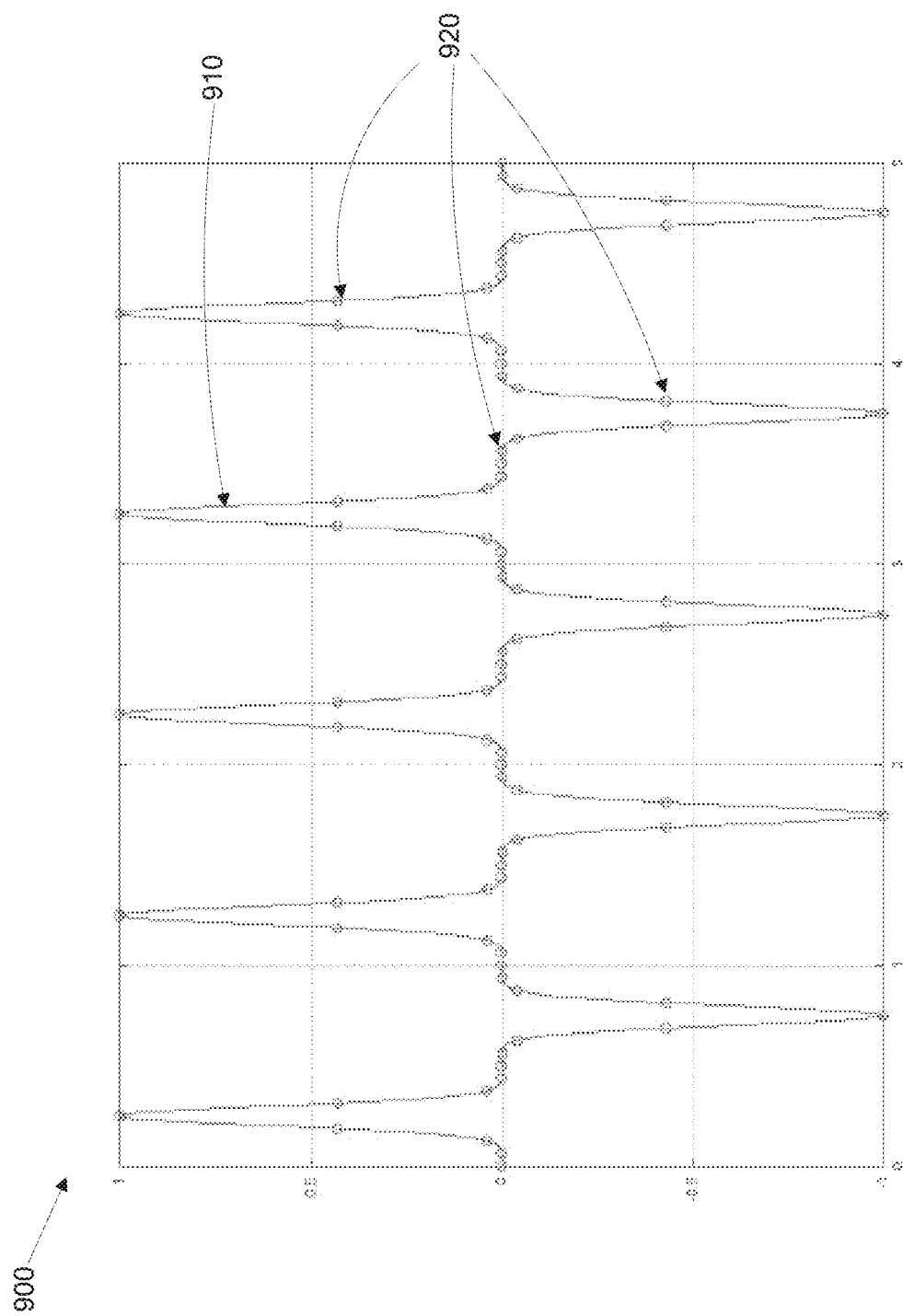
FIG. 9 shows a graph of a periodic signal sampled at 16 samples per period.
Figure 10:
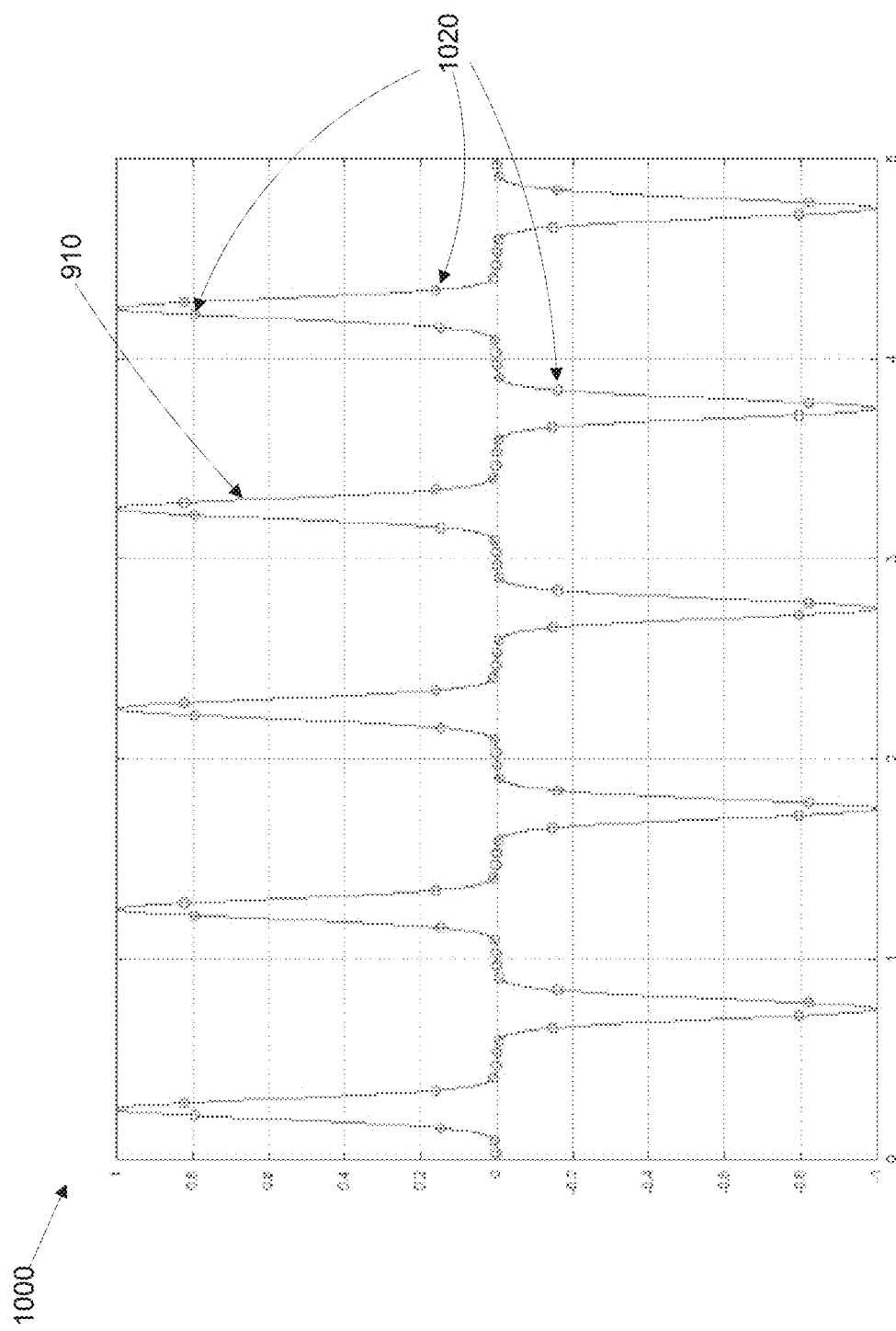
FIG. 10 shows a graph of a periodic signal sampled at 16 samples per period at a different alignment to that of FIG. 9.

This is illustrated in FIGS. 9 and 10. FIG. 9 shows a graph 900 of a signal 910 with sample points 920, sampled at a rate of 16 samples per period. FIG. 10 shows a graph 1000 of signal 910 with sample points 1020, also sampled at a rate of 16 samples per period, but with a different alignment of the signal with the sampling rate. Comparing FIG. 9 with FIG. 10, it is apparent that the sampling alignment of FIG. 10 does not capture the maximum and minimum values of signal 910.

Figure 11:
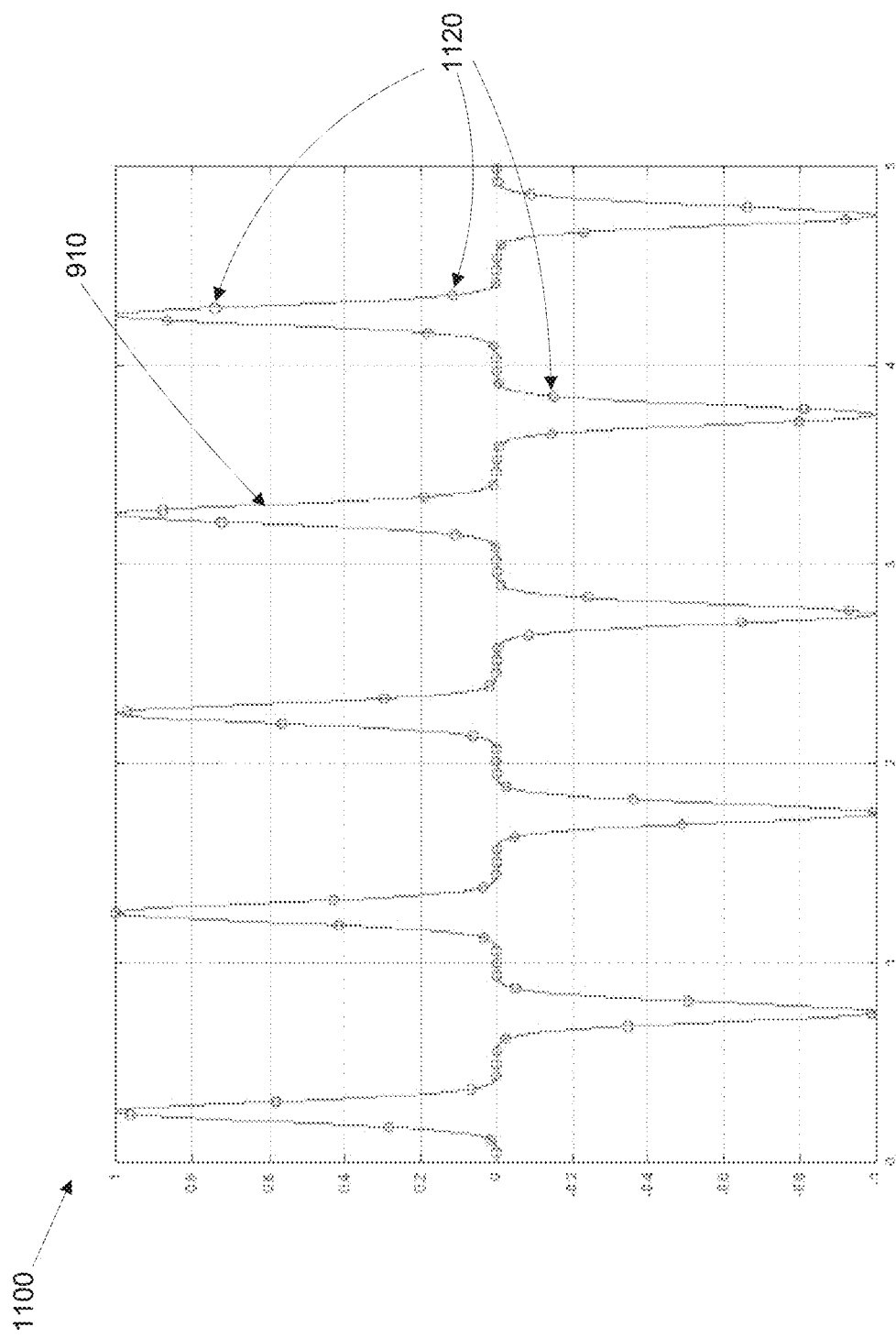
FIG. 11 shows a graph of a periodic signal sampled at 15.8 samples per period.
Figure 12:
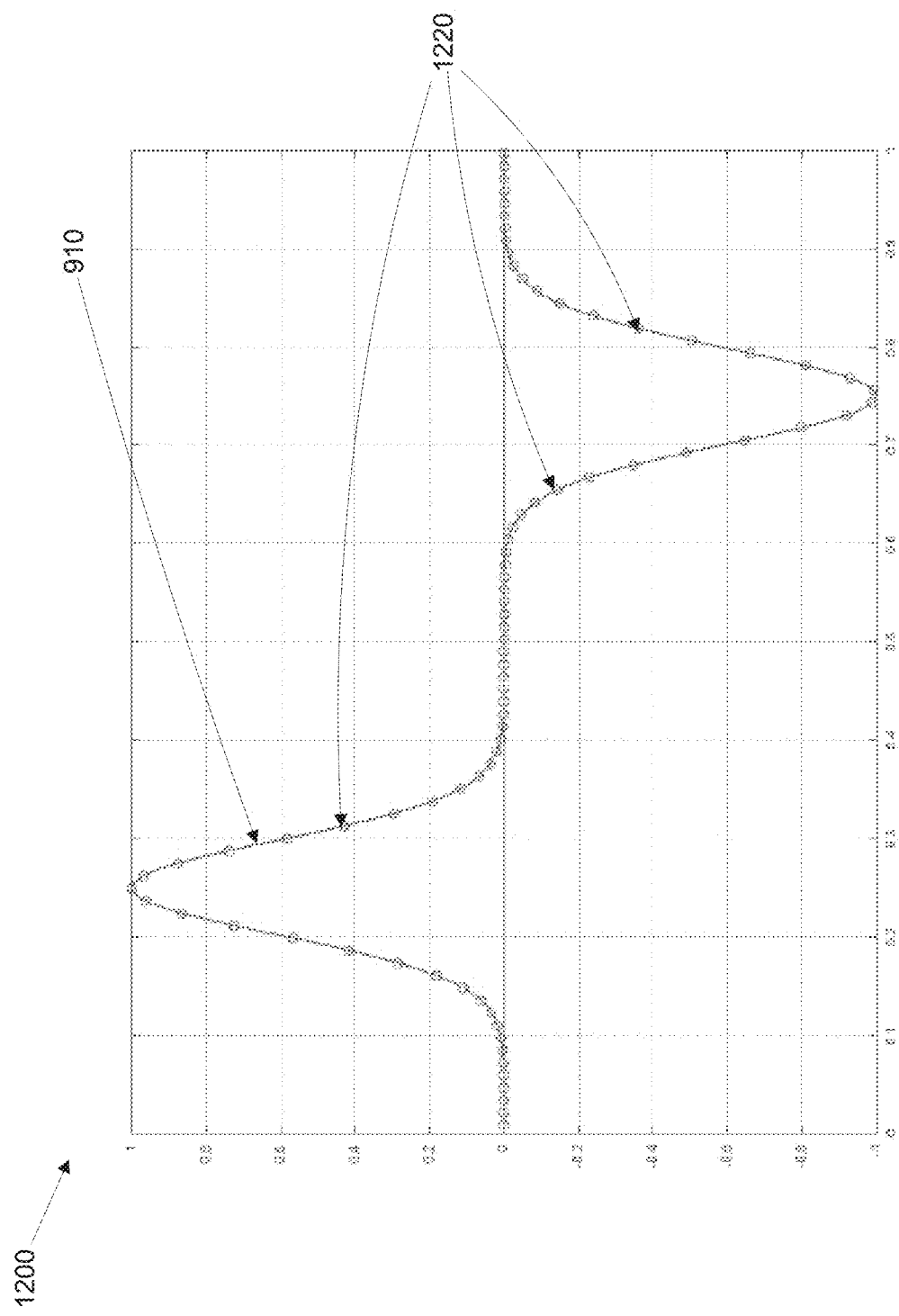
FIG. 12 shows a graph of a periodic signal sampled at 15.8 samples per period showing the effective sampling resolution.

Since the current in an appliance cable 310/410 is generally periodic, sampling across multiple mains periods allows gathering more samples, and, given suitably chosen sample times, allows an effective increase in the effective temporal resolution. FIG. 11 shows a graph 1100 of signal 910 with sample points 1120, when taking 79 samples during 5 periods, or sampling at a rate of 15.8 samples per period. FIG. 12 shows a graph 1200 of signal 910 with sample points 1220, also sampling at a rate of 15.8 samples per period, showing the resulting effective sampling resolution.

Sensor device 200 may sample for around 16 periods (i.e. 320 ms) in some embodiments, taking around 265 samples (i.e. at 828.125 Hz, and at 13250 Hz effective). This resolves sufficiently high harmonics such that the aliasing from the remaining ones is below the noise floor. In some embodiments, a different sampling duration may be used, such as 14, 15, 17, 18, 19 or 20 periods, for example. In some embodiments, the sampling time for sensor device 200 may be selected to ensure a good isolation for the magnetic field 750/850 from DC or other frequencies, but short enough that the actual mains frequency varying a fraction of a percent (as often occurs) will not cause problems.

According to some embodiments, sensor device 200 may sample data at intervals of around 30 seconds. In some embodiments, sensor device 200 may sample data at intervals of around 15, 20, 25, 35, 40, 45 or 50 seconds.

Sensor device 200 may be active for a particular time per sampling period. For example, sensor device 200 may operate for periods of approximately 400 ms, which may include time for sensor device 200 starting up, sampling, processing and communicating the sampled data. The active time for sensor device 200 may be dependent on both the sampling time, and the hardware of sensor device 200. In some embodiments, sensor device 200 may operate for periods of approximately 200 ms, 250 ms, 300 ms, 350 ms, 450 ms, 500 ms, 550 ms or 600 ms.

The strength of the 50 Hz residual magnetic field (i.e. the magnitude of the corresponding Fourier coefficient) is directly proportional to the amount of current in the cable. The conversion factor, however, depends on the (unknown) physical arrangement of the two wires relative to the magnetometer. As long as the arrangement stays the same, the factor stays the same—hence the need to fixate the cable in the sensor.

Figure 13:
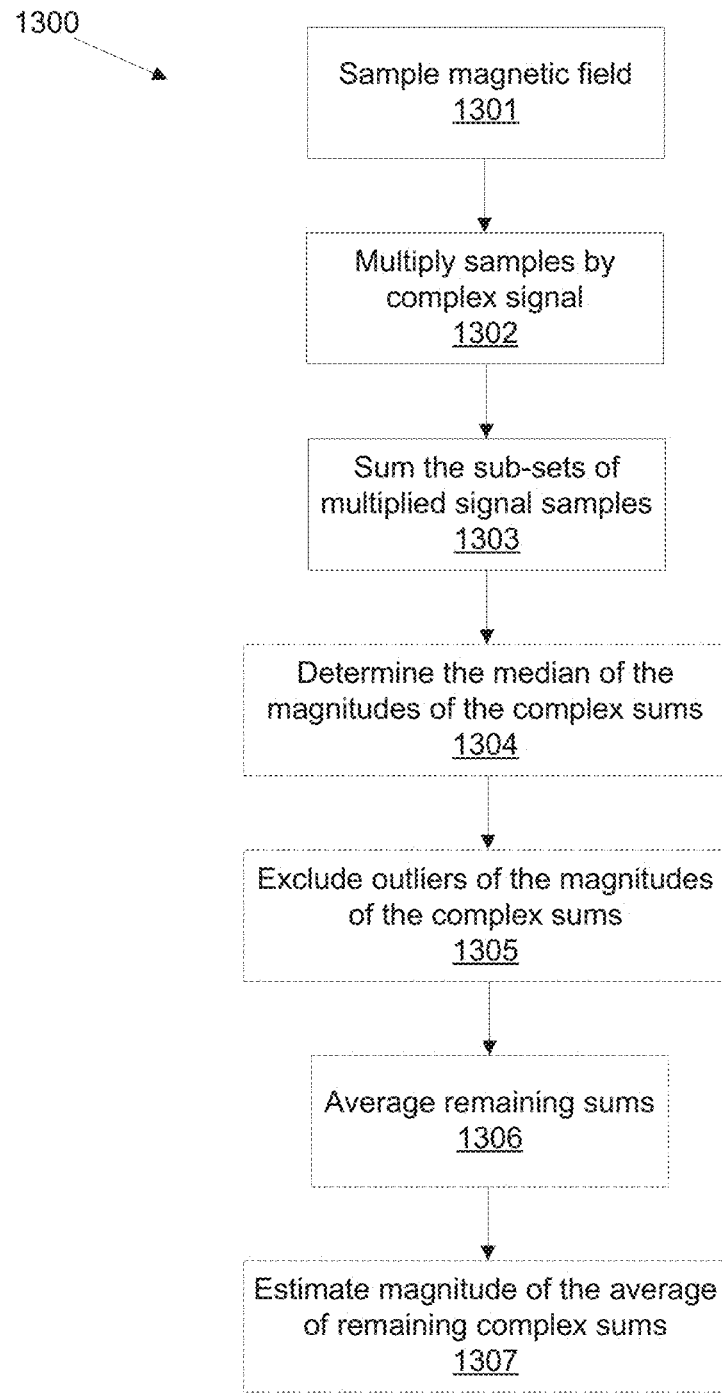
FIG. 13 shows a flowchart of a method for calculating a magnetic field strength according to some embodiments.

FIG. 13 shows a flowchart of steps taken to calculate a measure of the strength of the oscillating magnetic field based on the data measured by magnetometer 210. In some embodiments, each of the method steps may be performed by processor 240. In some alternative embodiments, sensor device 200 may send measured data to server system 140 via communications module 230 to perform one or more of the method steps. In some embodiments, some or all of the processing steps may be performed by an external device in communication with sensor device 200.

At step 1301, sensor device 200 samples the magnetic field 750/850 of a cable 310/410 of an appliance 110. In order to obtain a measure for the magnitude of AC current in a cable 310/410, at step 1302 the samples measured by sensor device 200 are multiplied with a complex AC mains signal, which may be a 50 Hz signal in some embodiments, and the results summed at step 1303. As described below, in some embodiments step 1303 may involve a number of separate complex sums, being the sums of separate subsets of the signal samples multiplied with the complex signal. This gives either a single, complex sum, or a number of separate complex sums.

The magnitude of the sums represents the size of the oscillating-at-mains-frequency magnetic field 750/850 observed by magnetometer 210, and its angle represents the phase difference between the start of sampling and the start of the mains period.

Given a sample duration of 320 ms, and a sample rate of slightly over 800 samples per second, for example, this results in a filter which is sufficiently discerning to suppress most non-mains-related magnetic fields, yet sufficiently relaxed to not be significantly affected by changes in mains frequency in the plus or minus one percent range.

Steps 1301 to 1303 may be sufficient when the current through cable 310/410 of appliance 110 is periodic, which may be true in most circumstances. However, when an appliance 110 is first connected or switched on, a single short, sharp spike of inrush current may be observed. For example, this switching may occur periodically with a fridge motor that turns on and off to keep the fridge at a particular temperature. Also, non-mains-related magnetic interference, such as the magnetic field induced by the very high but very short-lived current in a photographic flash, might also be spiky in nature.

In order to prevent the effect of such one-time spikes in the magnetic field from influencing the value reported for the AC mains signal oscillating field strength, samples taken by sensor device 200 may optionally be split into a number of separate groups, and steps 1302 and 1303 may be done independently for each group by processor 240 or server system 140. In some embodiments, the samples may be split into 2, 3, 4 5, 6, 7, 8, 9, or 10 groups, for example. At optional step 1304, the median of the separate magnitudes of each group of the complex sums may be determined, being the median of the calculated field strengths. This is done by taking the magnitude of the complex sums, giving one field strength estimate for each complex sum. At optional step 1305, any sums with a magnitude more than around 20% different from this median are excluded, and the remaining sums are averaged to at optional step 1306. In some embodiments the threshold percentage for excluding the sums may be around 15%, 25%, 30% or 35%. Finally, at step 1307, the final measure of the strength of the oscillating magnetic field is estimated, based on the magnitude of the average calculated at step 1307.

As mentioned above, commodity magnetometers provide separate measurements in three axes, "X", "Y" and "Z". Of these three axes, one is substantially parallel to cable 310/410, and thus experiences only a negligible amount, if any, of magnetic field 750/850 induced in the plane perpendicular to conductors 320/330/420/430. While conductors 320/330/420/430 in cable 310/410 may be slightly twisted, and the plane in which they induce magnetic field 750/850 may therefore not be exactly perpendicular to the direction of cable 310/410, the effect is small enough to be safely ignored. The direction of magnetic field 750/850 in the plane spanned by the other two axes, however, is dependent on the orientation and distance of the two current-carrying conductors 320/420 and 330/430 inside cable 310/410 relative to magnetometer 210. However, these measurements are generally unknown and not practically measurable. Thus, the sampling described with reference to the method of FIG. 13 is performed separately for each of the two axes, and the resulting measures for the strength of the oscillating magnetic field 750/850 are then vector-added to provide an ultimate, single magnitude of the strength of magnetic field 750/850.

The single number obtained by the method of FIG. 13 is an indication of the strength of the oscillating-at-mains-frequency residual magnetic field 750/850 that surrounds cable 310/410 of appliance 110. Except for minor noise-floor effects, it is directly proportional to the amount of AC current that flows through cable 310/410 to or from appliance 110.

The factor of proportionality, however, depends on the distance of magnetometer 210 from the current-carrying conductors 320/420 and 330/430, the distance between conductors 320/420 and 330/430, the presence or absence, and the geometry of, materials in the vicinity that influence the shape of magnetic field 750/850, and the sensitivity of magnetometer 210, which may vary from one magnetometer to the next. While it is difficult to calculate the proportionality factor, this factor remains constant as long as the geometry of sensor device 210 and cable 310/410 remain unchanged. The proportionality factor can therefore be determined by calibration against external power generation and consumption information.

Generally, consumers are not interested in the amount of current that passes through cable 310/410, but rather in the amount of power that is delivered through cable 310/410, for which they get charged, or possibly paid. Assuming that current and voltage are in phase, and assuming that the line voltage is nominal, converting current to power is straightforward. However, neither of these assumptions necessarily holds true in the real world. The power transferred through cable 310/410 may have a significant reactive part when the voltage and current are out of phase, and line voltage can depend heavily on how far from the closest transformer a consumer is located.

Fortunately, for a given appliance 110 in a given household, both line voltage and fraction of power that is reactive tend to vary very little. Thus, if the calibration mentioned above is made against external information that measures active power, rather than current, then these complicating influences get transparently included in the proportionality factor. One suitable source of such external information is smart meter 120, which does measure active power.

As described above, the values of the measured magnetic field 750/850 returned by sensor device 200 are proportional to the current through cable 310/410 to which sensor device 200 is attached, but the proportionality factor differs for different sensor device 200 installations, due to varying geometries and also due to sensitivity variations. Thus, on its own, sensor device 200 can provide accurate relative information, such as the current through a cable at a time T1 being r times as much as the current through that cable at time T0. However, sensor device 200 cannot provide absolute information as to the number of Amperes flowing through the cable at any given time. To obtain the latter information from sensor device 200, a proportionality factor needs to be determined, based on calibration against some sort of external information for which the absolute magnitude is known. According to some embodiments, the proportionality factor may be calculated based on independently measured reference data related to the power delivered by cable 310/410.

At any given time, the value S reported by sensor device 200 is a direct reflection of the AC mains signal component of the current flowing through the cable. i.e. For an AC mains signal of 50 Hz:

$$S = p * I^{50\,Hz} \quad \text{Equation 1}$$

where p is the proportionality factor, or equivalently, with q being 1/p:

$$I^{50\,Hz} = S * q \quad \text{Equation 2}$$

If at any time, the absolute value of $I^{50\,Hz}$ is known, determining p and q is trivial.

In order to reduce the influence of noise, and improve accuracy, one would typically use several known values $I_i^{50\,Hz}$ and their corresponding sensor readings $S_i$ at various times $T_i$. This would be done using trivial linear regression, minimizing the error term:

$$E^2 = \sum_i (I_i^{50Hz} - S_i * q)^2 \quad \text{Equation 3}$$

However, such calibration requires a direct measurement of the current through the cable, which as described above, may be undesirable or infeasible.

In general, real world users are merely interested in the active component of the power (i.e. the one that shows up on their electricity bill), ignoring the reactive component which has no financial consequences to them. Of course, current and active power are closely related:

$$P^A = I^{50\,Hz} * V * \cos \phi \quad \text{Equation 4}$$

where V is the line voltage, and cos φ is the power factor, resulting from a phase angle of φ between current and voltage. Substituting Equation 2 into Equation 4 yields:

$$P^A = S * q * V * \cos \phi \quad \text{Equation 5}$$

For most specific applications, V and φ are near enough to constant to be treated as such without introducing significant error. Line voltage V depends mainly on the voltage drop between the household and the transformer which converts the distribution network's high voltage to line voltage, and thus tends to stay close to constant for any particular household. The phase angle φ, which indicates to what degree a particular load deviates from being purely resistive towards being either inductive or capacitive, is a characteristic of the load of an appliance 110, and thus tends to not change unless the load is changed. However, this assumption is somewhat invalid for appliances 110 which can operate in a number of modes. For example, a washing machine using a motor to rotate its drum would tend to be somewhat inductive, while the same washing machine using its heating element to heat up water would be purely resistive.

Assuming a constant V and φ, we can define $Q = q * V * \cos \phi$ and get $$P^A = S * Q \quad \text{Equation 6}$$

Equation 6 matches the form of Equation 2, and thus Q can be obtained in analogous manner, as long as $P^A$ is known at one or more times. This may be considerably easier to achieve than knowledge of $I^{50\,Hz}$, because smart meter 120 can measure $P^A$. So if it is possible to ensure that the appliance 110 for which Q is to be determined is the only appliance 110 connected to smart meter 120, the existing smart meter 120 can be used to calculate Q. Modern electricity meters may provide the value of $P^A$ either on a display or via a network connection, allowing for direct application of Equation 6. Others may only provide a running total E of energy consumed, i.e. the integral of $P^A$ over time. For such meters, Equation 6 needs to be integrated:

$$\int_{T_1}^{T_2} P^A(t)\,dt = Q * \int_{T_1}^{T_2} S(t)\,dt \quad \text{Equation 7}$$

In Equation 7, $\int_{T_1}^{T_2} P^A(t)\,dt$ is the metered energy consumption between times $T_1$ and $T_2$, which is equivalent to $E(T_2) - E(T_1)$. Because sensor device 200 may be configured to measure at discrete times $t_i$ with $t_{i+1}=t_i+\Delta t$, $\int_{T_1}^{T_2}S(t)dt$ is approximated by $$\Delta t * \sum_{T_1 \leq t_i < T_2} S(t_i).$$

Thus:

$$E(T_2) - E(T_1) = Q * \Delta t * \sum_{T_1 \leq t_i < T_2} S(t_i) \quad \text{Equation 8}$$

From this, Q can be easily obtained given the required observations. Again, if more than one set of observations is available, simple linear regression can be used to minimise the influence of noise and improve accuracy.

Determining Q using the smart meter 120 requires the user to isolate the appliance 110 to which sensor device 200 is attached, to temporarily disconnect all other appliances 110 from smart meter 120. This requires considerable effort, and can be highly disruptive. Thus, while theoretically appealing, it is not practical in reality. Modern smart meters 120 provide frequently updated measurements of the overall household's active power $P_H^A$. Those measurements are often reported via a local wireless network, which may be a ZigBee network in some embodiments. At any given time t, this overall power is the sum of a large number N of individual loads:

$$P_H^A(t) = \sum_{i=1}^{N} P_i^A(t) \quad \text{Equation 9}$$

If load 1 is the appliance 110 to which sensor device 200 is attached, then by substituting in Equation 6, we get:

$$P_H^A(t) = S(t) * Q + \sum_{i=2}^{N} P_i^A(t) \quad \text{Equation 10}$$

Subtracting $S(t)*g$ yields:

$$P_C^A(t) = P_H^A(t) - S(t) * g = S(t) * (Q - g) + \sum_{i=2}^{N} P_i^A(t) \quad \text{Equation 11}$$

Here, $P_C^A(t)$ is the compensated power, being the overall household's power use at time t minus an estimation of the power used by an appliance 110 that is being measured by sensor device 200, or sensor-equipped load number 1. This estimation is obtained using g as the proportionality factor between S(t) and $P_1^A$. Evaluating Equation 11 at different times $t_1$ and $t_2$ gives:

$$D(t_1, t_2, g) = P_H^A(t_2) - P_H^A(t_1) - (S(t_2) - S(t_1)) * g \quad \text{Equation 12}$$

$$= (S(t_2) - S(t_1)) * (Q - g) + \sum_{i=2}^{N} P_i^A(t_2) - P_i^A(t_1)$$

Here, D(t1, t2, g) is the change in $P_C^A$ between times t1 and t2.

If $P_1^A$ and $P_1^A \ldots N$ are independent, then it can easily be seen that the expectation value $$A(g) = \mathbb{E}_{t_1,t_2} |D(t_1, t_2, g)| \quad \text{Equation 13}$$

$$= \mathbb{E}_{t_1,t_2} \left| (S(t_2) - S(t_1)) * (Q - g) + \sum_{i=2}^{N} P_i^A(t_2) - P_i^A(t_1) \right|$$

is minimized for g=Q.

In general, the loads for appliances 110 are not independent for arbitrary choices of $t_1$, $t_2$. For example, the power consumed by a TV may be strongly correlated to the power consumed by the lighting of the room the TV is located in, as both are more likely to be used in the evenings on weekdays when people get home from work, for example. Also, the expectation value cannot be directly calculated, but must be estimated by examining $|D(t_1, t_2, g)|$ for a number of given times.

In practice, however, by choosing a large number of pairs $(t_1, t_2)$ with $t_1$ and $t_2$ close together, and by observing changes over short time frames only, the loads of appliances 110 are close enough to independent such that minimising the estimate of A(g) tends to yield a g that is an excellent approximation for the unknown, desired calibration factor Q.

Straightforwardly implementing the method described above occasionally results in wildly inaccurate estimates. Particularly for loads which change very rarely, and for which thus $S(t_2)-S(t_1)$ is near zero for most $(t_1, t_2)$ with $t_1$ and $t_2$ close together, there is a significant risk of the minimum of A(g) being due to a random correlation of the sensor noise present in S and some large change(s) in one of the loads 2 ... N. Similarly, an actual change in $P_1^A$ and the corresponding change in S may by chance coincide with a large change in another load, and the minimum of A(g) may again be dominated by such random coincidence, masking the effect of the other, less prominent changes in $P_1^A$.

For practical use, the general process described above of choosing a proportionality factor estimate in such a way as to minimise the variation that remains in $P_C^A$ using that factor is used. However, a number of changes can be made to the process to increase robustness and minimise the influence of noise.

Instead of measurements taken at only two times $t_1$ and $t_2$, a larger number M of (consecutive) samples of the measurement of sensor device 200 can be used for each individual calculation. For example, M=10 sensor samples may be used in some embodiments. Alternatively, M=5, 6, 7, 8, 9, 11, 12, 13, 14, 15, or another number of sensor samples may be used. Consequently, instead of calculating the absolute difference between $P_C^A(t_1)$ and $P_C^A(t_2)$, the standard deviation $$\sigma_{P_C^A}$$

of values in M-sized tuples $P_C^A(t_i)$ for i=1 ... M and the $t_i$ being consecutive, can be used.

Minimization of A(g) with respect to g relies on the term $(S(t_2)-S(t_1))*(Q-g)$, or rather, the equivalent terms when using a larger number of samples. If the load of the monitored appliance does not change during the time covered by those samples, then ideally all the $S(t_i)$ would be exactly the same, and the term would be zero, regardless of g. In reality, the sensor's measurements S are noisy, and thus these terms would make a contribution to the equivalent of A(g) which is dependent on g, but which is not a reflection of any actual relationship between $P_1^A$ and S.

For this reason, an estimate of the sensor's noise level $\sigma_{sensor}$ is made. Then for each tuple considered above, the observed standard deviation $\sigma_{samples}$ of the corresponding sensor samples is compared with $\sigma_{sensor}$. Only tuples for which the $\sigma_{sensor}$ exceeds $\sigma_{samples}$ by at least a factor F are used in the calculation of the equivalent of A(g). According to some embodiments, this factor is F=5. In some embodiments, this factor may be F=1, 2, 3, 4, 6, 7, 8, 9, or another factor. This limits the observations used to estimate the proportionality factor Q to those times during which $P_1^A$ actually changed, and thus $S(t_2)-S(t_1)$ is meaningfully related to $P_1^A(t_2)-P_1^A(t_1)$. It excludes times during which $P_1^A(t_2)-P_1^A(t_1) \approx 0$ and during which $S(t_2)-S(t_1)$ is thus largely or exclusively determined by random sensor noise.

According to Equation 11, $P_C^A(t)=P_H^A(t)-S(t)*g$. This means that any sensor noise present in S will also be present in $P_C^A$, and that the level at which it is present depends on g. However, g can be chosen such as to minimise the overall variation in $P_C^A$, based on the argument that the correct g, i.e. g=Q, will result in the best removal of $P_1^A$ from $P_H^A$. The variable amount of sensor noise, completely unrelated to the relationship between $P_1^A$ and S, that presents in $P_C^A$ and thus in $\sigma P_C^A$ interferes with this argument.

Given the known level of sensor noise $\sigma_{sensor}$ as described above, it is possible to attempt to compensate for its contribution to $$\sigma_{P_C^A}:$$

$$\hat{\sigma}_{P_C^A} = \sqrt[+n]{\sigma_{P_C^A}^2 - g^2 \sigma_{sensor}^2} \qquad \text{Equation 14}$$

where $$\sqrt[+n]{x} = \sqrt[n]{x}$$

for $x \geq 0$ and zero otherwise.

Selecting g to minimize the straightforward sum of the $$\hat{\sigma}_{P_C^A}$$

for all selected tuples can occasionally result in an erroneous choice, when a change in S by chance coincides with a large change in another, unrelated load, and thus in $P_H^A$. A particular g may remove that coincidental large change from $P_H^A$, and thus reduce the corresponding $$\hat{\sigma}_{P_C^A}$$

and consequently the sum by a large amount. That amount may be larger than the amount realisable by correctly choosing g and thus removing all genuine changes of $P_1^A$ from $P_H^A$.

In order to reduce the influence of individual large changes, and to instead bias the selection towards consistency across all tuples, the $$\hat{\sigma}_{P_C^A}$$

are not summed up directly, but instead rather their k-th root. According to some embodiments, this value may be k=10. According to some embodiments, this value may be k=5, 6, 7, 8, 9, 11, 12, 13, 14, 15, or another value.

Figure 14:
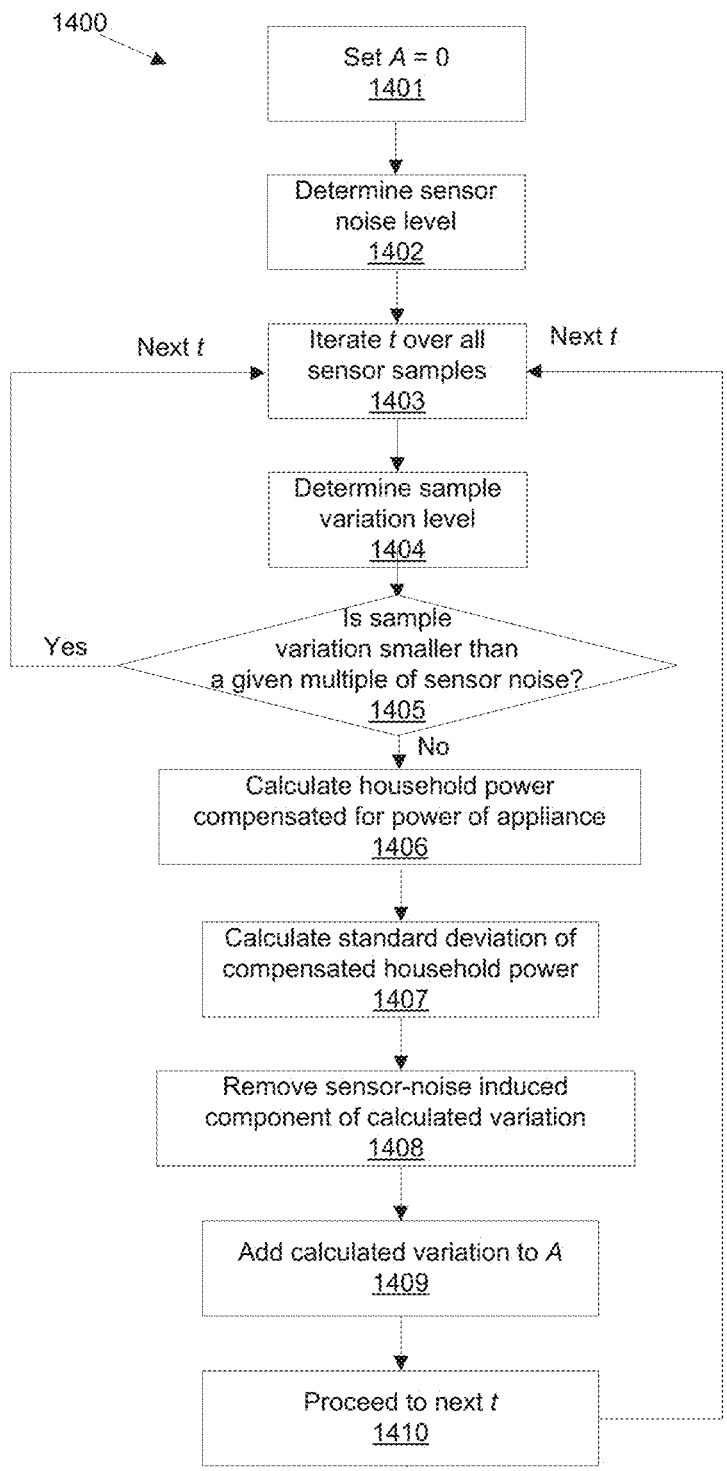
FIG. 14 shows a flowchart of a method for calculating a fitness value for a given proportionality factor according to some embodiments.

FIG. 14 summarises the steps required to estimate g of Q, by minimising the result A with respect to g. In some embodiments, sensor device 200 and energy monitoring device 130 may send measured data to server system 140 via communications module 230, and server system 140 may perform one or more of the method steps.

At step 1401, A is set to equal 0. At step 1402, the noise level $\sigma_{sensor}$ of sensor device 200 is calculated. At step 1403, t is iterated over each of the samples from sensor device 200 to be considered. At step 1404, $\sigma_{samples}$ is calculated over a short period of time starting at t, $\sigma_{samples}$ being the observed standard deviation of M for all samples starting at t. At step 1405, if $\sigma_{samples}$ is smaller than $F*\sigma_{sensor}$, that sample is ignored, t is increased, and the method moves back to step 1403. Otherwise, the method proceeds to step 1406. At step 1406, $P_C^A$ is calculated according to the given proportionality factor, over a short period of time starting at t, $P_C^A$ being the household power compensated for the estimate of $P_1^A$ for the corresponding sample times, being the active power of the appliance 110 to which sensor device 200 is attached. This will depend on g. At step 1407, $$\sigma_{P_C^A}$$

is calculated, being the observed standard deviation in $P_C^A$ from step 1406. At step 1408, $$\hat{\sigma}_{P_C^A} = \sqrt[+0]{\sigma_{P_C^A}^2 - g^2 \sigma_{sensor}^2}$$

is calculated, being the remaining variation in $P_C^A$ after accounting for added sensor noise from sensor device 200. At step 1409, $$\sqrt[k]{\hat{\sigma}_{P_C^A}}$$

is added to A. At step 1410, t is incremented and the method is repeated from step 1403.

The method described with relation to FIG. 14 can be performed by an exhaustive search of all values considered for g. However, A(g) is generally a smooth function with a single, well defined minimum, allowing the use of a variety of much faster standard methods for finding that minimum.

The method described with relation to FIG. 14 depends on the monitored load of appliance 110 changing at distinct times between discrete and significantly different power levels. This dependency is fulfilled for almost all common appliances. However, it is not necessarily fulfilled for the "load" presented if appliance 110 is a photovoltaic solar system. The output of such a system changes continuously. Also, while on partly cloudy days, significant changes can occur over very short time scales, no such significant changes may be present in the data available for calibration.

The continuous changes in solar generation make it possible to derive useful information regarding the proportionality factor Q not merely from a few select sample times of interest, as outlined above, but from all sample times collected during daylight hours. Because all other appliances 110 in a household tend to stay at discrete power levels for extended periods of time, for most of those sample times, the only change to $P_H^A$ is attributable to the solar generation. Thus, the factor g is chosen so as to maximise the number of times that, after compensating for the estimated solar generation, a zero change is observed.

Similar to the previous approach, $P_H^A$ (t) is defined as the household power use as reported by the smart meter 120, and $P_C^A(t) = P_H^A(t) - S(t)*g$ is defined as the power use after compensating for the estimate of the solar system's contribution. $P_C^A$ (t) obviously depends on g. Also, as before, the noise level $\sigma_{sensor}$ of sensor device 200 is estimated. In addition, the noise level $\sigma_{meter}$ of smart meter 120 is estimated.

For each pair of consecutive samples in $P_C^A$ (t), the likelihood is calculated that the observed difference represents a zero change in a hypothetical, noiseless version of $P_C^A$ (t). As both the noise from sensor device 200 and the noise from smart meter 120 are considered to be normal distributed, and they are considered to be independent, that likelihood can be modelled by a normal distribution centred around zero, and with a standard deviation $\sigma_{combined}$ of $$\sigma_{combined} = \sqrt{\sigma_{meter}^2 + g^2 * \sigma_{sensor}^2} \qquad \text{Equation 15}$$

and thus the likelihood measure l(t), as $$l(t) = \frac{1}{\sigma_{combined}\sqrt{2*\pi}} e^{-\frac{(P_C^A(t) - P_C^A(t+1))^2}{2\sigma_{combined}^2}} \qquad \text{Equation 16}$$

Because a large number of sample times can be used for the estimation, and because for most of those times, the measure l(t) is expected to be fairly large, no explicit biasing towards consistency, as described above for the method described with respect to FIG. 14 is necessary. In fact, the opposite is beneficial—the l(t) can be weighted according to the corresponding differences in $P_H^A$, emphasising the influence of sample times where large differences were observed, and where a successful compensation thus requires a very accurate value of g. The result of this weighting is called L(t):

$$L(t) = l(t) * |P_H^A t - P_H^A t + 1| \qquad \text{Equation 17}$$

The value chosen for g is simply the one that maximises $$A(g) = \sum_{t, daylight(t)} L(t) \qquad \text{Equation 18}$$

Modern solar power inverters typically have fairly large capacitances in their output stages. This capacitance presents a purely capacitive load to the household grid, resulting in significant current that is 90° out of phase with the voltage V, and thus a significant reactive power component. And unlike in the common appliance case discussed above with relation to FIG. 14, the ratio of reactive power to active power (and thus the phase angle φ and ultimately the power factor cos φ) are not even remotely constant for a solar power inverter.

The observed sensor reading S is $$S = \sqrt{S^{A^2} + S^{R^2}} \qquad \text{Equation 19}$$

where $S^R$ is the sensor response to the current 90° out of phase, and $S^A$ is the sensor response to the in-phase current, i.e. ultimately to active power.

The magnitude $S^R$ can be estimated because just after sunset, and just before sunrise it is known that $S^A = 0$. Therefore, $S^R$ can be observed directly as $S^R = S$ at those times. Furthermore, because the capacitance is constant, $S^R$ is also constant throughout the day. Thus, once $S^R$ has been observed, $S^A$ can easily be calculated as $$S^A = \sqrt[+0]{S^2 - S^{R^2}} \qquad \text{Equation 20}$$

where $$\sqrt[+0]{x}$$

is defined as above.

Equation 20 for $S^A$ has a large derivative for S near $S^R$. Given that S(t) is a noisy sensor reading, which in the ideal, noiseless case would have value $S^R$ at sunrise and sunset, this large derivative can result in severe amplification of the noise from sensor device 200. However, in practice, there are very few times t when $S^A(t)$ is non-zero, yet small enough that $S(t) = \sqrt{S^A(t)^2 + S^{R^2}}$ is near $S^R$. Consequently, this noise amplification can reasonably be avoided by treating all values $S(t) \approx S^R$ as if they were exactly $S^R$, and thus the in-phase component as zero. In the current implementation, this is done whenever $S(t) \leq S^R + 3 * \sigma_{sensor}$.

Additionally, it is known that $S^A(t) \neq 0$ only during daylight hours. This ultimately yields $$S^A(t) = \qquad \text{Equation 21}$$
$$\begin{cases} \sqrt[+0]{S^2(t) - S^{R^2}(t)}, & \text{if } S(t) > S^R + 3 * \sigma_{sensor} \cap \text{daylight}(t) \\ 0, & \text{otherwise} \end{cases}$$

The $S^A(t)$ so calculated are then used instead of S(t) for the algorithms described above, as well as for calculating the solar power production reported to the user.

In the embodiments described above with respect to FIGS. 13 and 14, the phase of the measured current $I^{50\ Hz}$ relative to the phase of the mains voltage V was not calculated. While a complex result was obtained as the output from the 50 Hz isolation, the phase of this result is random, because the timing of the samples taken by sensor device 200 is randomly aligned to the voltage's phase. However, according to some embodiments, it may be desirable to know the phase $\phi_{current}$ of the measured current $I^{50}$ $_{Hz}$ relative to the AC voltage V, being whether the current $I^{50}$ $_{Hz}$ rises and falls at the same time as the voltage V, or if not, how much earlier or later.

Measurements of the magnitude and phase of the current $I^{50\ Hz}$ can be combined into a complex number, represented by a point in a two-dimensional coordinate system. The magnitude determines how far away from the origin the point is, and the phase determines in what direction it is located. When the current is in-phase, i.e. rises and falls at the same time as voltage, then the point will be on the horizontal axis, also called the "real" axis. If it is out-of-phase, the point will be at a certain angle to the horizontal axis, with some vertical, or "imaginary" component. The "real" component of AC current results in "active power", i.e. actual energy transfer, which can perform actual work and which consumers are charged for. The "imaginary" component results in "reactive power", which is merely shifting energy back and forth, without converting it into work, and generally without the consumer having to pay for it.

As long as the phase of the current for a monitored appliance 110 stays constant, applying a single proportionality factor p to translate the observed magnitude of the magnetic field S (and thus the observed current $I^{50\ Hz}$) into an active power value is valid and straightforward. Unfortunately, for many real world appliances 110, the phase $\phi_{current}$ does not stay constant. For example, when running its motor, a washing machine presents significant reactive power, but while heating the water, it consumes purely active power. Similarly, the compressors used in self-defrosting fridges present significantly reactive power, yet during the regular defrost cycle, the load is almost purely active. With no information from sensor device 200 to discern between those distinct consumption modes, any single proportionality factor p may provide an inaccurate result at least some of the time.

One particular example of an appliance 110 where phase $\phi_{current}$ is important is for solar inverter systems. Solar inverter systems typically have a large output capacitor. This capacitor presents a significant reactive load to the grid, regardless of the presence or absence of solar generation. Thus, the current observed in a cable 310/410 connecting a solar inverter system to the grid is a combination of a near-fixed reactive component and a highly-variable active component. Although the magnitude of the reactive component of the current can be estimated (as described above with reference to FIG. 14), the operation required for removing the reactive component from the measured combined signal leads to strong noise amplification when the active component is small. Also, the method as described above with respect to FIG. 14 assumes a constant reactive component.

Though the actual variations in the reactive component may be quite small, they experience the same amplification when the active component is small. Furthermore, estimation (and removal) of the reactive component is made more difficult because many inverters disconnect their output stage, either fully or partially, during times of darkness. This is especially problematic in systems using several micro-inverters in parallel, as each inverter is likely to disconnect at a different time, and thus at any time, the observed reactive load may be representative of an arbitrary number of inverter output stages.

The measurements from the magnetometer 210 in sensor device 200 naturally contain a certain amount of noise. This noise is also present in the calculated 50 Hz component of the magnetic field S, and results in repeated measurements forming a circular point cloud around the point representing the actual complex value in the complex coordinate system. This noise level is generally small compared to the signal resulting from the operation of an appliance 110, and thus over time, the occasions during which it results in increased magnitude will balance out with occasions during which it results in a decreased magnitude. In visual terms, the average distance from the coordinate system's origin to the points in a circular point cloud with its centre far away from the origin well approximates the distance from the origin to that centre.

However, when there is little or no current $I^{50\ Hz}$ through cable 310/410, the actual complex signal describing the magnitude and phase of the current $I^{50\ Hz}$ is close to the origin, and the point cloud centred around it envelops the origin. In that case, the average magnitude of points in the point cloud is significantly larger than its centre's magnitude.

What this means is that, for small or zero signals, when observing only the amplitude of the measurements S, the signal will be lost in the noise, and cannot be recovered through averaging the observations over time. In particular, a zero signal (i.e. the appliance is inactive, no current flowing) would result in a series of small positive reported magnetic magnitudes, which translate into a series of small positive power consumptions.

This is problematic for appliances 110 that have a low duty cycle, as even the small erroneous power draw, when reported over the extended periods of inactivity, can become highly significant compared to the power consumed during the comparatively short active times of appliance 110. For this reason, according to some embodiments sensor device 200 may be configured to report a zero magnitude whenever the measured magnetic field magnitude S is small enough to be merely an artefact of noise.

That strategy is appropriate for appliances 110 which do indeed have zero power draw during periods of inactivity. However, many modern devices have non-zero standby current, and this so-called standby or vampire power accounts for up to 10 percent of total domestic power consumption. Thus, such devices also being reported as consuming zero power while inactive may be undesirable in some cases.

Figure 15:
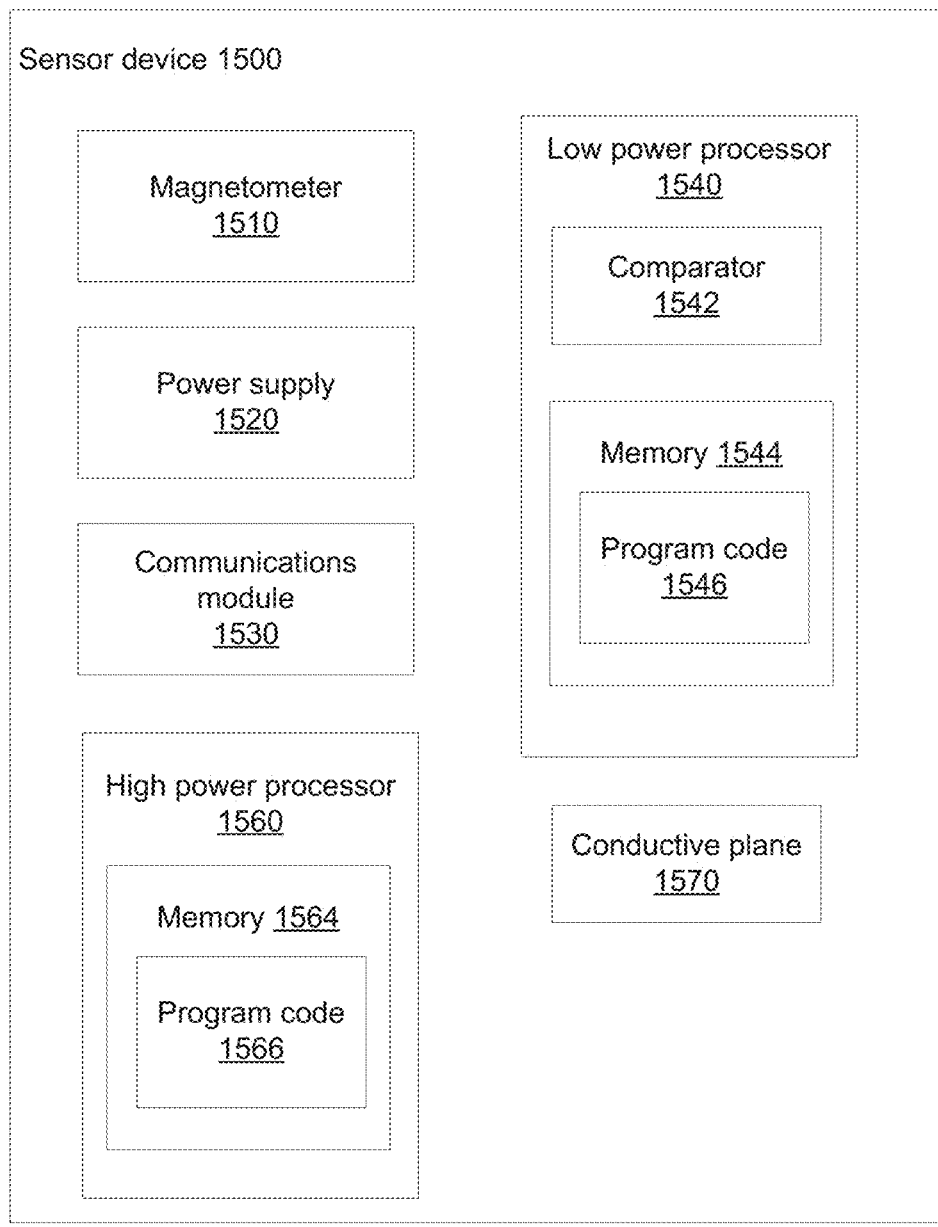
FIG. 15 shows a block diagram of an alternative sensor device that may form part of FIG. 1 according to some embodiments.

To overcome this, some embodiments relate to an alternative sensor device 1500, as shown in FIG. 15. Sensor device may include a magnetometer 1510, power supply 1520, and communications module 1530, which may be similar or identical to parts 210, 220 and 230 of sensor device 200. Sensor device 1500 may be configured to calculate the phase $\phi_{current}$ as well as the magnitude of current $I^{50\ Hz}$. To do so, sensor device 1500 may make use of the alternating electrostatic field that exists near any conductor carrying AC voltage. According to some embodiments, sensor device 1500 may comprise a comparatively large conductive plane 1570, connected to an extremely high impedance input, on its processor 1540. Conductive plane 1570 may be a sheet, plate or panel made of copper or another conductive material, such as aluminium or silver.

Conductive plane 1570 may be of a relatively large size, and according to some embodiments the size of conductive plane 1570 may be limited by the size of the housing of sensor device 1500. In some embodiments, conductive plane 1570 may be positioned outside of sensor device 1500 and may be bigger than the housing of sensor device 1500. According to some embodiments, conductive plane 1570 may be around 8 mm by 45 mm in size. According to some embodiments, conductive plane 1570 may be between 5 mm and 30 mm in width, where width is the dimension running latitudinally across cable 310/410. According to some embodiments, conductive plane 1570 may be between 10 mm and 20 mm in width. According to some embodiments, conductive plane 1570 may be between 30 mm and 150 mm in length, where length is the dimension running longitudinally along cable 310/410. According to some embodiments, conductive plane 1570 may be between 50 mm and 100 mm in length.

Processor 1540 may comprise a comparator 1542 and memory 1544, the memory storing program code 1546, executable by processor 1540 to perform the functions as described. When sensor device 1500 is attached to a cable 310/410, conductive plane 1570 may be configured to be in close vicinity to the conductors 320/420 and 330/430 in the cable 310/410, resulting in capacitive coupling between the potential of conductive plane 1570 and the potentials of conductors 320/420 and 330/430. According to some embodiments, the distance between conductive plane 1570 and conductors 320/420 and 330/430 may be as close as possible, and may be limited by the insulation on cable 310/410, the thickness of the casing or housing of sensor device 1500, and the diameter of the conduit in which cable 310/410 is enclosed. According to some embodiments, the distance between conductive plane 1570 and conductors 320/420 and 330/430 may be less than 50 mm. According to some embodiments, the distance between conductive plane 1570 and conductors 320/420 and 330/430 may be less than 35 mm. According to some embodiments, the distance between conductive plane 1570 and conductors 320/420 and 330/430 may be less than 20 mm.

The potential of Active conductor 320/420, relative to Earth 440, changes at the frequency of the AC mains voltage, being 50 Hz, for example, whereas the potential of Neutral conductor 330/430 (and optionally the Earth 440) does not change. Thus, the potential of conductive plane 1570, which is capacitively coupled to all two (or three) conductors, will change at 50 Hz as well.

Figure 19:
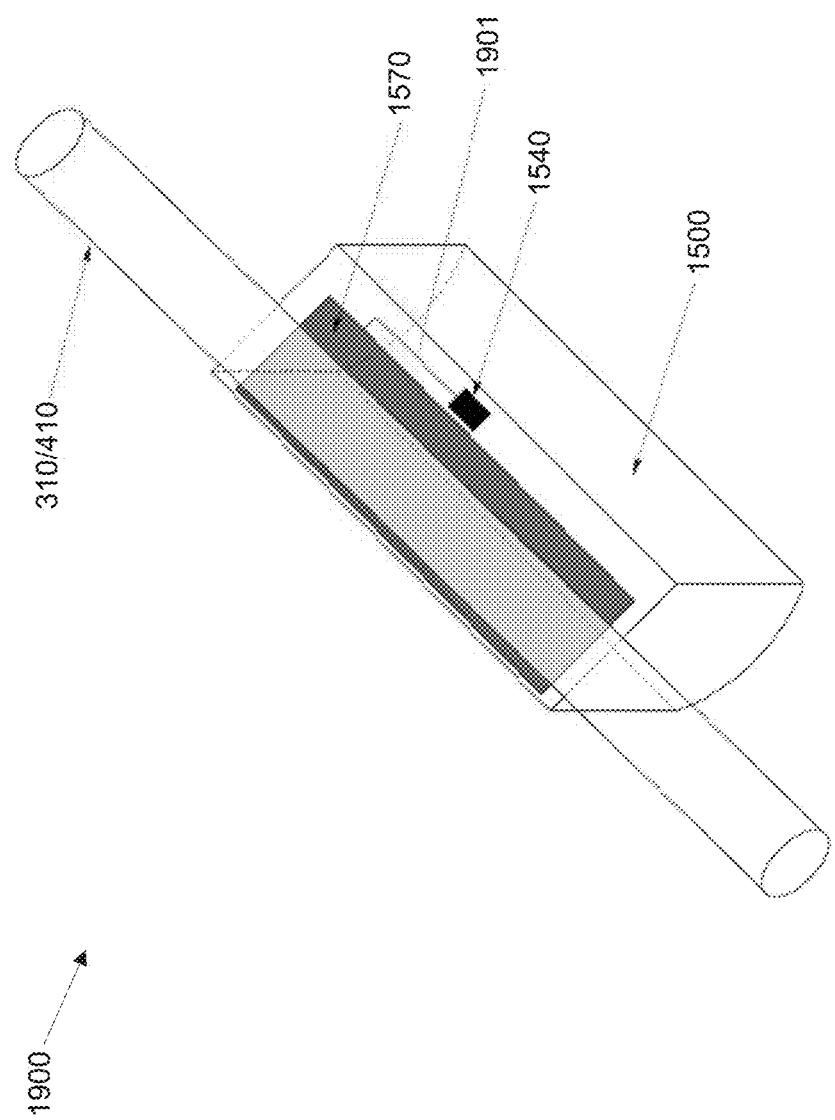
FIG. 19 shows the sensor device of FIG. 15 in further detail.

Sensor device 1500 is shown in more detail in FIG. 19, which illustrated the physical relationship between sensor device 1500, processor 1540, and conductive plane 1570. Conductive plane 1570 is positioned in close proximity to cable 310/410, and is connected to processor 1540 through a wire 1901 connected to a pin of processor 1540.

The input impedance R of processor 1540 and the capacitance C between conductive plane 1570 of sensor device 1500 and the cable's conductors 320/420 and 330/430 form an RC circuit. Because the capacitance C is very small, this RC circuit results in a phase shift Δϕ despite the very large R. This means that its potential changes in sync with, but not exactly at the same time as, the potential of Active conductor 320/420. The amount of phase shift depends on R and C, both of which are largely fixed for a fixed physical arrangement of sensor device 1500 and cable 310/410. Thus, while the phase Δϕ shift will vary between installations, for each installation it will stay largely constant.

In processor 1540, the analogue signal from conductive plane 1570 is connected to a comparator 1544, translating the analogue signal into a digital on/off signal. A standard software or hardware phase-locked loop (PLL) implementation is then applied separately to both the on-off and off-on transitions. The maxima and minima of the signal are then located at the midway points between the PLL-predicted transition points. Also, as a side effect, the PLLs track the mains frequency.

Unlike sensor device 200, sensor device 1500 is configured to synchronise to the voltage phase repeatedly, and is also able to adjust its sampling rate to match variations in the period ω of the mains supply. Because of this, sensor device 1500 can apply a more sophisticated sampling strategy.

According to some embodiments, sensor device 200, as described above with reference to FIG. 2, for example, may achieve extended battery life by running processor 240 at a very low duty cycle, only spending about 400 milliseconds sampling once every 30 seconds. However, sensor device 1500 may be configured to constantly perform the software PLLs for voltage phase tracking, and also spread out sampling, thus requiring processor 1540 to manage magnetometer 1510 every four seconds. To nonetheless increase battery lifetime of sensor device 1500, a separate, high-power processor 1560 may be for communication, while processor 1540 may be a low-power processor used to manage magnetometer 1510. Processor 1560 may comprise memory 1564 storing program code 1566, executable by processor 1560 to perform the communication functions.

Figure 16:
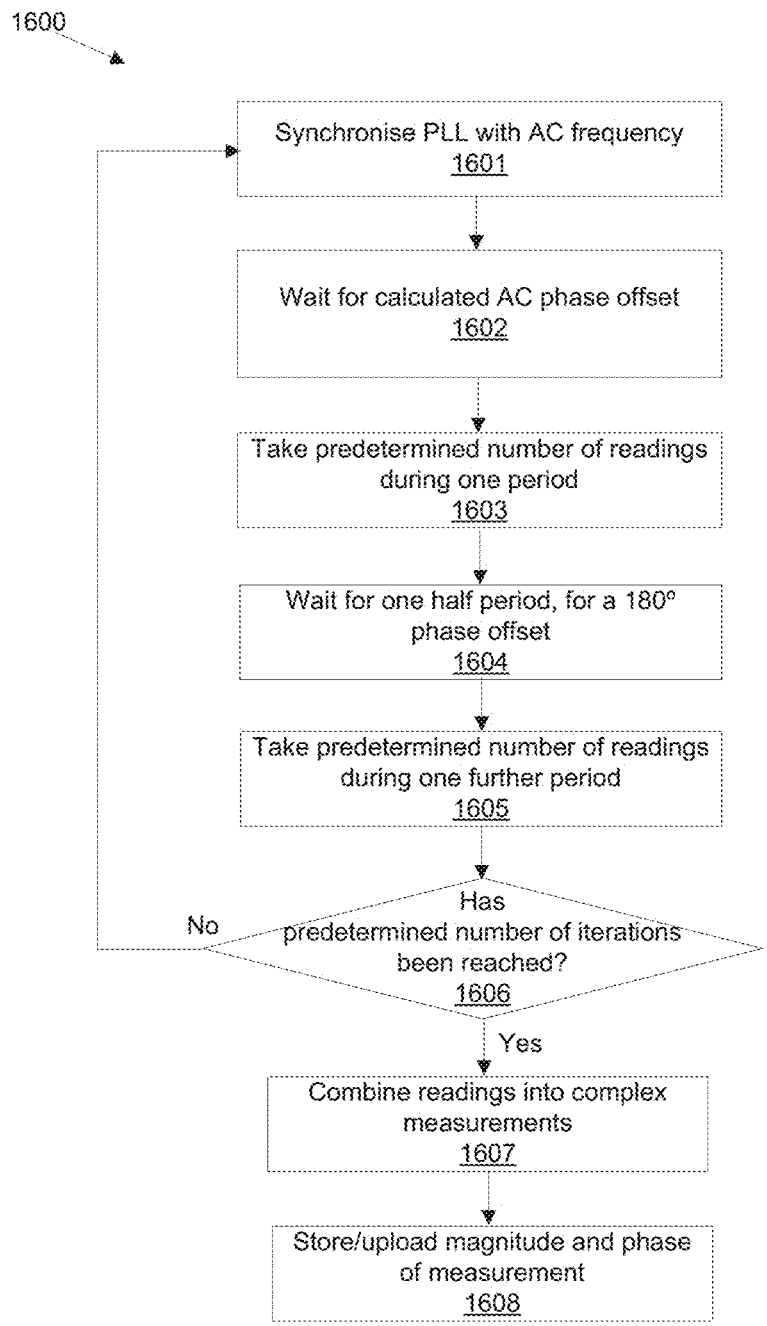
FIG. 16 shows a flowchart of a method for calculating a phase shift according to some embodiments.

Referring to FIG. 16, t method for determining magnitude and phase of a measurement is described. According to some embodiments, each measurement may consist of 7 pairs of sample sets with 15 samples per set. Different numbers of pairs and samples-per-set are possible. According to some embodiments, the factors 3, 5, and 7 may appear in the number of pairs and the number of samples per set, providing resilience against aliasing due to $3^{rd}$, $5^{th}$ and $7^{th}$ order harmonics in the measured current. For example, 7 pairs of 3×5 samples per set, 3 pairs of 5×7 samples per set, or 5 pairs of 3×7 samples per set, as well as other combinations of 3, 5 and 7, could be used. According to some embodiments, the set size may be selected based on the supported rate of the magnetometer 1510 used. Within each set, the samples may be spaced at exactly $$\frac{1}{15\omega}.$$

the two sets making up each pair may be timed to start exactly $$\frac{3}{2\omega}$$

apart. This means the two sets are taken at corresponding points in the cycle, 180° apart, providing for optimal rejection of constant magnetic field components, as well as aliasing artefacts due to high-order odd harmonics.

Each pair of sample sets is synchronised to start at a specific offset from the PLL-predicted maximum of the voltage phase tracking, as described below with reference to steps 1601 and 1602. This offset increases by $$\frac{1}{105\omega}$$

from pair to pair, providing for an effective sampling frequency of 210 samples per period (being 7 pairs of sample sets making up 14 sample sets, each set having 15 samples), preventing aliasing from 3rd, 5th and 7th order harmonics.

As described below with reference to steps 1603 to 1605, sensor device 1500 is configured to take a plurality of samples. Because sensor device 1500 can synchronise to the voltage potential phase repeatedly, the pairs of sample sets need not be taken in quick succession. In fact, spacing them out allows the PLLs to refine their locking in between. Also, as each pair of sample sets is an independent measurement, taking them at distinct points through an overall measurement period provides a level of averaging. For this reason, according to some embodiments sensor device 1500 may space the pairs around four seconds apart. According to some embodiments, a different time period may be used, such as 1 second, 2 seconds, 3 seconds, 5 seconds or 6 seconds, for example. If frequent full samples were desired, this time period may be further decreased to tens or hundreds of milliseconds, depending on the time required to re-synchronise to the voltage phase in each cycle. However, more samples increase the power consumption of sensor device 1500, and may decrease battery life.

Because the current sampling performed by sensor device 1500 is synchronised to the voltage phase of the mains power, the phase information in the result of the 50 Hz isolation is meaningful. Consequently, sensor device 1500 may be configured to upload both magnitude and phase information to server system 140, as described below with reference to step 1608. According to some embodiments, the separate results corresponding to the three axes of magnetometer 1510 are not combined on sensor device 1500, but are instead separately uploaded to server system for processing by an external device 150 or in the cloud.

As outlined above, sensor device 1500 may be configured to return separate complex measurements $S_x$, $S_y$ and $S_z$, corresponding to the x, y and z axes of magnetometer 210. Each of these measurements is a combination of the effect of the current corresponding to the complex power $P^{50\ Hz}$ on that axis, and a noise term:

$$S_x = w_x * P^{50\ Hz} + n_x$$

$$S_y = w_y * P^{50\ Hz} + n_y$$

$$S_z = w_z * P^{50\ Hz} + n_z \quad \text{Equation 22}$$

Given a set of complex weights $\omega_x$, $\omega_y$ and $\omega_z$, a simple over-determined equation system, easily solved for $P^{50\ Hz}$ according to least squared error, can be obtained by zeroing the noise terms. However, the different axes of magnetometers 210 exhibit different levels of noise $\sigma_x$, $\sigma_y$ and $\sigma_z$, so a better system to solve is $$\frac{w_x}{\sigma_x} * P^{50\ Hz} = \frac{S_x}{\sigma_x} \quad \text{Equation 23}$$

$$\frac{w_y}{\sigma_y} * P^{50\ Hz} = \frac{S_y}{\sigma_y}$$

$$\frac{w_z}{\sigma_z} * P^{50\ Hz} = \frac{S_z}{\sigma_z}$$

To determine the weights $\omega_x$, $\omega_y$ and $\omega_z$, an additional complex variable r is temporarily introduced:

$$w_x = \frac{v_x}{r} \quad \text{Equation 24}$$

$$w_y = \frac{v_y}{r}$$

$$w_z = \frac{v_z}{r}$$

This introduces two additional degrees of freedom, meaning that the $v_x$, $v_y$ and $v_z$ merely need to determine the relative phase and magnitude of the weights ω, without providing absolute values for either.

It is noted that while the phase of the magnetic field resulting from the current through cable 310/410 should be the same in each axis of magnetometer 210, commodity magnetometers actually take a three-axes sample by sampling the three axes in sequence, i.e. at slightly different times. For this reason, the phases as observed through a commodity magnetometer may differ slightly.

Given a set of S(t) at a number of times $t_i$, and a set of chosen $v_x$, $v_y$ and $v_z$, solving the over-determined equation system $$\frac{v_x}{\sigma_x} * J(t_i) = \frac{S_x(t_i)}{\sigma_x} \quad \text{Equation 25}$$

$$\frac{v_y}{\sigma_y} * J(t_i) = \frac{S_y(t_i)}{\sigma_y}$$

$$\frac{v_z}{\sigma_z} * J(t_i) = \frac{S_z(t_i)}{\sigma_z}$$

for J at each $t_i$ provides a set of $J(t_i)$ (. In turn, given a set of S(t) at times $t_i$ as well as a corresponding set of J(t), the over-determined $$J(t_1) * v_x = S_x(t_1) \quad \text{Equation 26}$$

$$J(t_2) * v_x = S_x(t_2)$$

$$\ldots$$

$$J(t_n) * v_x = S_x(t_n)$$

can be solved for $v_x$; $v_y$ and $v_z$ can be calculated in a corresponding manner.

Starting with $v_x=1$, $v_x=1$ and $v_z=1$, iterating equations 25 and 26 will provide successive, eventually converging sets of J and v. Given equations 23, 24 and 25, it can be seen that $$P^{50\ Hz}(t) = J(t) * r \quad \text{Equation 27}$$

To determine r, it is expressed as the product of a real value $r_a$, and a unity-magnitude complex value $r_p$, encapsulating the amplitude and phase of r, respectively.

$$r = r_a * r_p \quad \text{Equation 28}$$

For appliances 110 that are active solar inverter systems, $P^{50\ Hz}(t)$ is a combination of a variable active component, corresponding to the power produced by the solar panels, and a constant reactive component resulting from the capacitance in the output stage.

To determine $r_p$, the J(t) are sorted by amplitude, and $J_1$ calculated as the average of the top quartile, as well as $J_2$ as the average of the second-top quartile. $r_p$ is then chosen such that $$Im(r_p * J_1) = Im(r_p * J_2) \quad \text{Equation 29}$$

Once $r_p$ has been determined, $r_a$ can be determined by applying the algorithm above with respect to FIGS. 13 and 14, taking Re $(r_p * J(t))$ as S(t) in equations 10 onwards.

For appliances 110 that are not solar inverter systems, no a-priori knowledge exists regarding the active and reactive components of the current. Thus, the $r_p$ cannot be calculated in a way similar to that in the previous section.

Instead, the algorithm from equation 10 onwards as described above with respect to FIGS. 13 and 14 is applied repeatedly. We define $B(r_p, r_a)$ as the A (g) that results from applying that algorithm with Re $(r_p * J(t))$ as the real-valued sensor samples and $g=r_a$ as the proportionality factor. The chosen values for $r_a$ and $r_p$ are those that minimise $B(r_p, r_a)$. As before, while these can be determined by exhaustive search, $B(r_p, r_a)$ is generally a smooth function, and thus much faster minimisation methods can be applied.

Once $v_x$, $v_y$ and $v_z$ as well as $r=r_a*r_p$ have been determined, the final weights can easily be determined by applying equation 24:

$$w_x = \frac{v_x}{r}$$
$$w_y = \frac{v_y}{r}$$
$$w_z = \frac{v_z}{r}$$

These weights describe the strength of electromagnetic coupling between the current through cable 310/410 and the three axes of magnetometer 210, as well as the phase shift experienced by the voltage phase tracking, and thus indirectly the strength of the electrostatic coupling between the cable's conductors 320/420 and 330/430 and the phase tracking's conductive plane 1570. The weights are determined by the physical circumstances of the installation of sensor device 1500, and as long as those circumstances are unchanged, remain constant. Thus, the weights need to be recalculated whenever sensor device 1500 is moved, whether intentionally or inadvertently. Once calculated, the weights can be used to transform future magnetic measurements into complex power values $P^{50\ Hz}$ for presentation to the user. Typically, only the active power, $Re(P^{50\ Hz})$ will be presented.

The method for determining the magnitude and phase of measurement as described above is further illustrated at FIG. 16. At step 1601, a PLL is synchronised with the known AC frequency of the appliance 110. At step 1602, the calculated AC phase offset is waited for, to ensure the measurements are taken in synchronisation with the AC mains signal. At step 1603, the predetermined number of readings are taken, during one period of the AC mains cycle. At step 1604, a further half a period is allowed to elapse, to produce a phase offset of 180° between the measurement and the AC mains signal. At step 1605, the predetermined number of readings are taken again, during one further period of the AC mains cycle.

At step 1606, sensor device 1500 determines whether or not the predetermined number of iterations has been reached. If not, the method iterates back to step 1601. If the predetermined number of iterations has been reached, the measurements taken by sensor device 1500 are combined into complex measurements at step 1607. Subsequently, at step 1608, the determined magnitude and phase of the measurements are stored on sensor device 200, and/or uploaded to server system 140.

Figure 18:
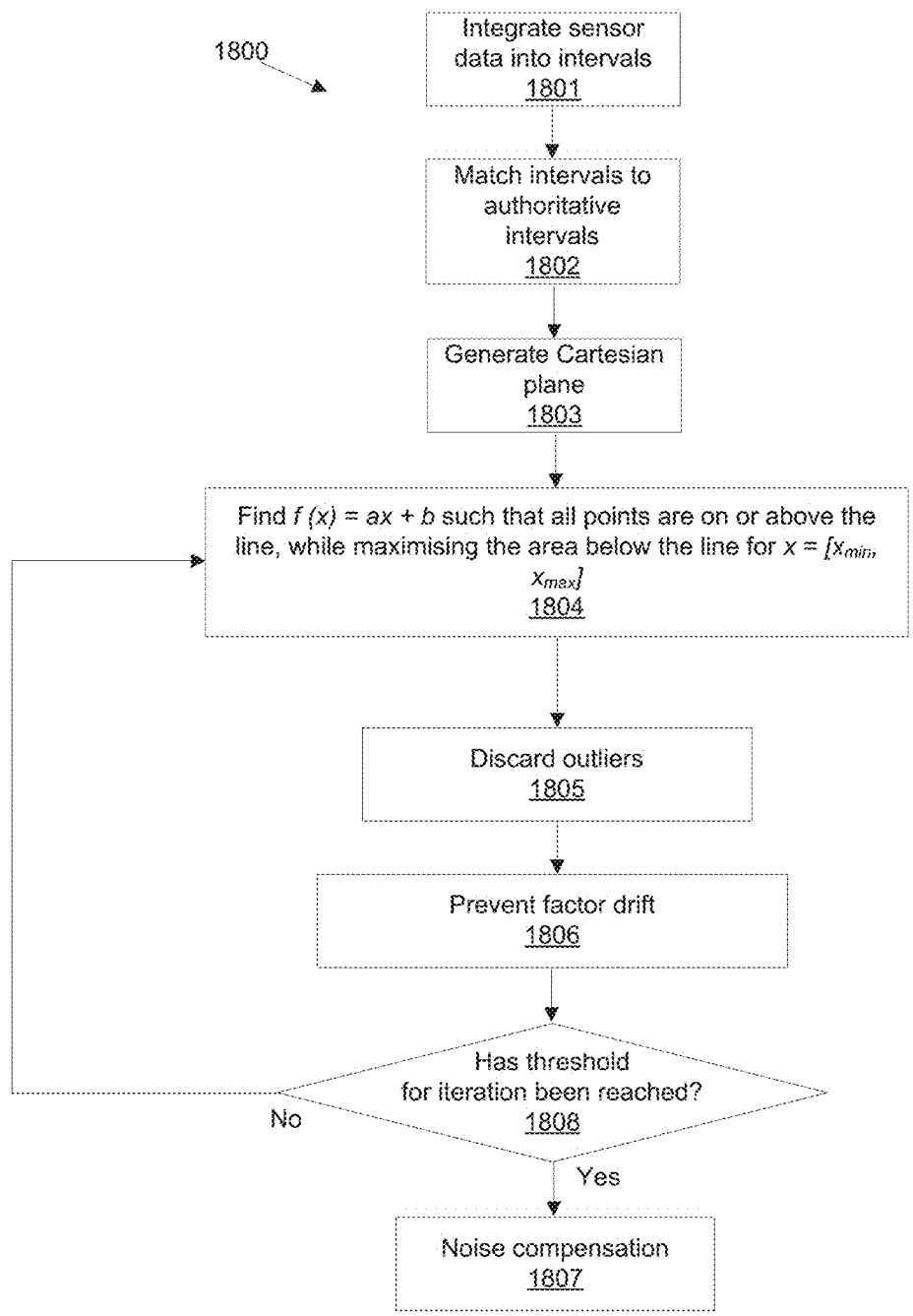
FIG. 18 shows a flowchart of a method for calculating a proportionality factor according to some embodiments.

The embodiments described above relate to a situation in which authoritative whole-house measurements are available on demand. However, in many cases the authoritative whole-house measurements are only available as interval aggregates, as opposed to frequent instantaneous demand measurements. Determining the proportionality factor for sensor device 200/1500 where only interval aggregate measurements are available requires a different approach. FIG. 18 relates to a method for calculating the proportionality factor that draws on the understanding that there is a minimum base load below which the whole-house consumption would not go were it not for the solar installation (or other generation facility).

As an initial step 1801 the sensor data generated by sensor device 200/1500 is integrated into intervals matching those of the authoritative reference, e.g. 30 minute intervals where the authoritative reference generates aggregate data every 30 minutes. These intervals are then matched with the corresponding authoritative intervals at step 1802. According to some embodiments, these intervals may be 10 minutes, 20 minutes, 40 minutes, or another time period.

Figure 17:
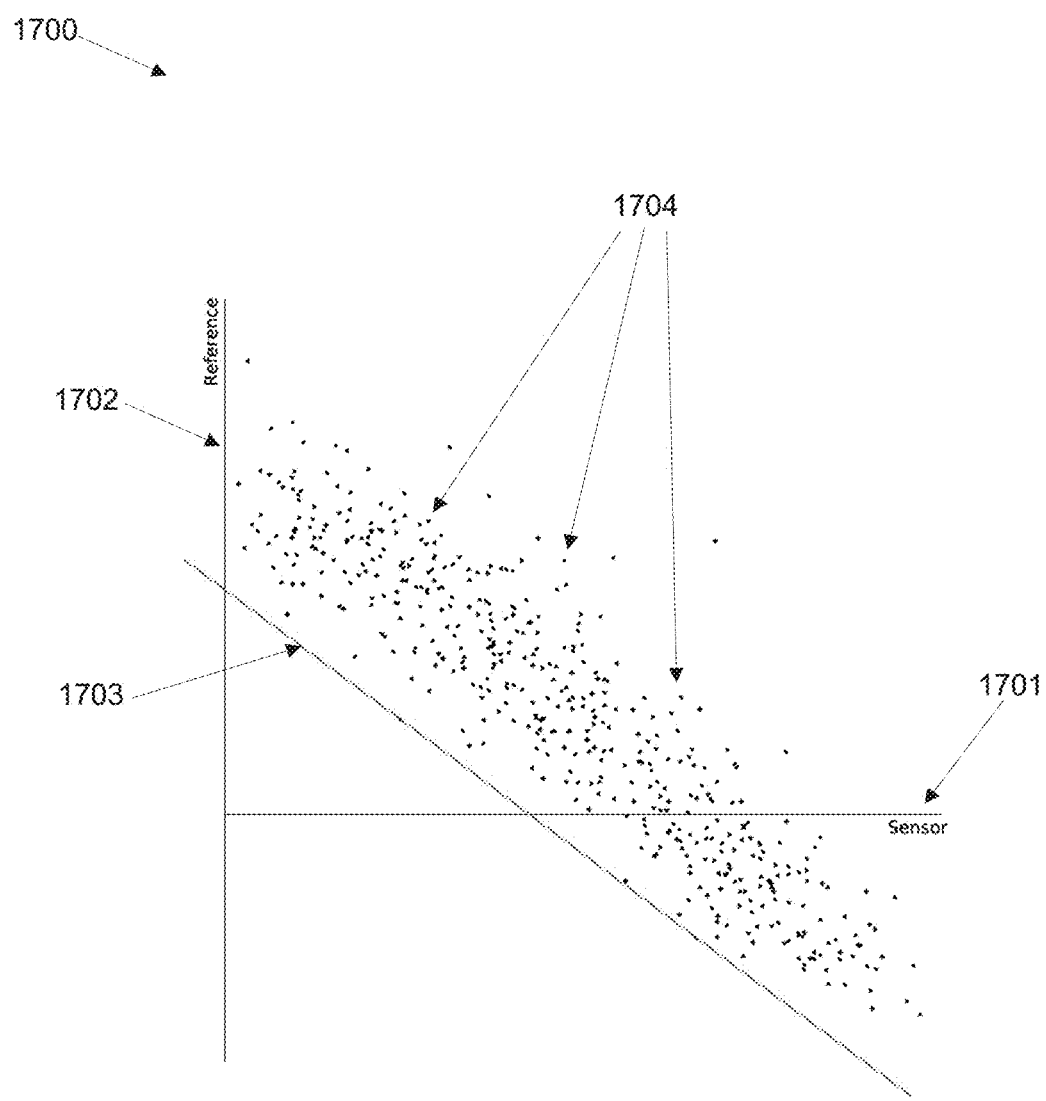
FIG. 17 shows a graph of household net consumption as a function of solar generation.

The process of estimating the proportionality factor for sensor device 200/1500 effectively takes place in a Cartesian plane 1700, as illustrated in FIG. 17, which is generated at step 1803. The (now aggregated) sensor data is used on the X-axis 1701, with the reference data on the Y-axis 1702. In the case of multiple generation sources, additional axes would be needed.

The factor being sought can be represented by the line 1703 which keeps all points 1704 on or above it, while maximising the area underneath it. In a perfect system without noise and outliers this would be most straight forward. Reality however requires compensation for these, and this is the driver for the chosen iterative algorithm described below with further reference to FIG. 18.

The iterative algorithm comprises several parts:
At step 1804, finding the $f(x)=ax+b$ such that all points are on or above the line, while maximising the area below the line for $x=[x_{min}, x_{max}]$;
At step 1805, discarding or disregarding outliers in a weighted order;
At step 1806, preventing factor drift due to disregarded points; and
At step 1807, noise compensation to dampen factor oscillation.

At step 1804, given the limited data set being operated upon, finding $f(x)=ax+b$ may be performed using an exhaustive left-to-right search, evaluating candidate lines 1703 iteratively. Many optimisations are possible, such as observing that to compare the areas under two candidate lines A and B, $fA(x_{min})+fA(x_{max})$ can be compared to $fB(x_{min})+fB(x_{max})$. This comparison will be referred to as the "area under A and B comparison".

At step 1805, to avoid the situation where line 1703 pivots around a single (likely outlying) data point 1704, a weighted system is used. Each point 1704 is given an initial weight based on the sensor value output by sensor device 200/1500. This is done since higher readings are considered more influential, and as such outliers there would be more detrimental if kept around. Other weighting methods may also be suitable.

For each candidate line 1703, the two end points are weighed off against each other, and the "heavier" one disregarded. The kept point gains the weight of the disregarded point. In many cases this weighting results in a see-saw effect, and is very effective at eliminating outliers in an appropriate manner. After each disregard of a potential outlier, a new optimal $f(x)=ax+b$ is calculated.

While the disregarded points $PD_i$ may include outliers, many "good" data points will also be disregarded during the application of step 1803. Rather than fully disregarding the data point in each pass, a small but noticeable improvement to the end result can be seen if the disregarded data point is allowed to influence the finding of the next candidate line. As such, at step 1806, rather than solely working to optimise the area, the following algorithm is used to slightly bias comparisons between two possible choices of lines towards candidate lines similar to those already observed:

$$ref \text{ points} = [(minx, maxy), PD_0, PD_1, \ldots, (maxx, maxy)] \quad \text{Equation 30}$$

$$cmp_A = \sum_{p \in ref\ points} (|y_p - f_A(x_p)|)$$

$$cmp_B = \sum_{p \in ref\ points} (|y_p - f_B(x_p)|)$$

$$chosen = \begin{cases} A, & \text{for } cmp_A \leq cmp_B \\ B & \text{otherwise} \end{cases}$$

In equation 30 above, (minx, maxy) refers to a point above the very left of the point cloud 1704. Thus, moving the left side of a candidate line 1703 up will move it closer to this point. (maxx,maxy) is a similar point above the very right of the point cloud 1704. Moving the right side of a candidate line 1703 up will move it closer to this point. Reducing the combined distance between line 1703 and those two points (minx, maxy) and (maxx,maxy) implements the area under A and B comparison as referred to above.

$PD_0$, $PD_1$ etc. are points from the bottom of the point cloud 1704 which were disregarded previously, in step 1805.

The terms $cmp_A$ and $cmp_B$ are used to calculate the combined distance of candidate lines A and B to all of the points given above. As outlined above, the rationale for looking to reduce the distance between a candidate line 1703 and points (minx, maxy) and (maxx,maxy) is to implement the comparison at step 1804. The rationale for trying to reduce the distance between candidate line 1703 and PD0, PD1 etc. is to implement step 1806.

The estimated factor tends to oscillate from pass to pass, even during the later passes. To avoid the distorting effect of picking only the last calculated factor, at step 1807 the estimated factor from each pass is kept. An averaging or smoothing function is then applied to determine the final factor. The chosen function can be, for example, a plain average, or application of a normal distribution probability based on previously established noise levels in the data of sensor device 200/1500, or even an evaluating, exhaustive search near a for the optimal match against the data points produced by sensor device 200/1500.

At step 1808, the method checks whether a threshold has been reached. If not, the method moves back to step 1804 and generates a new line 1703 based on the new set of data points, such that the algorithm is applied in several passes, refining the line in each pass as outliers are disregarded. The number of passes required is somewhat flexible, and depends on several factors such as signal noise, time differences between the sensor data and reference data edges, and likelihood of outliers in the observations. According to some embodiments, the threshold is related to a total weight of the disregarded data points compared to the total weight of all of the data points in the point cloud.

Empirically, stopping after a predetermined percentage, which may be around 7%, of the combined weight of all samples has been disregarded, yields consistently good estimates. Alternatively, according to some embodiments, the threshold may be set based on the number of samples that have been disregarded. Once the threshold is reached, the method moves to step 1807. To avoid the distorting effect of picking only the last calculated factor, at step 1807 the estimated factors from all passes are combined, using an averaging or smoothing function to determine the final factor. An averaging or smoothing function is then applied to determine the final factor. The chosen function can be, for example, a plain average, or application of a normal distribution probability based on previously established noise levels in the data of sensor device 200/1500, or even an evaluating, exhaustive search near the factors from all passes for the optimal match against the data points produced by sensor device 200/1500.

The algorithm operates in terms of line 1703 represented by f(x)=ax+b, where the proportionality factor produced is the term a, while b is the perceived base load.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

What is claimed is:

1. A method of determining power delivered by a cable, the method comprising:
    receiving data related to a residual magnetic field produced by the cable;
    determining a proportionality factor relating the received data to the power delivered by comparing the residual magnetic field data to independently measured reference data related to the power delivered by the cable; and
    based on the proportionality factor, determining the power delivered by the cable;
    wherein the cable comprises at least two conductors.

2. The method of claim 1, wherein the independently measured reference data related to the power delivered by the cable relates to known power consumption data for at least one appliance, including data related to the power consumption through the cable.

3. The method of claim 2, wherein the known power consumption data is aggregate data, being the sum of data related to power consumption through the cable and power consumption unrelated to power consumption through the cable.

4. The method of claim 2 or claim 3, further comprising receiving known power consumption data for the premises from a smart meter monitoring the power consumption for the premises.

5. The method of claim 4, further comprising calculating a premises power value compensated for the independently measured reference data related to the power delivered by the cable.

6. The method of claim 5, wherein the cable is configured to deliver power from a solar power installation, and smart meter data during sunlight hours is compared to smart meter data during sundown hours to determine a premises power value compensated for the independently measured reference data related to the power delivered by the cable.

7. The method of claim 1, further comprising estimating a noise level for a sensor from which the residual magnetic field data is received, and determining a standard deviation of the received residual magnetic field data.

8. The method of claim 7, further comprising selecting which residual magnetic field data values to use to determine the proportionality factor based on the relationship between the estimated noise level for the sensor and the standard deviation of the received residual magnetic field data.

9. The method of claim 7 or claim 8, further comprising compensating for the estimated noise level for the sensor when determining the proportionality factor.

10. The method of claim 1, wherein the magnetic field data comprises a number of samples taken for a predetermined duration at a predetermined sample rate.

11. The method of claim 10, wherein the duration and the sample rate are determined based on the frequency of the power delivered by the cable, wherein the duration and the sample rate allow for samples to be taken during a plurality of periods of the power delivered by the cable.

12. The method of claim 1, further comprising calculating a magnetic field strength based on the magnetic field data by multiplying the magnetic field data by a complex signal related to the frequency of the power delivered by the cable, determining a median field strength based on a set of magnetic field data, excluding outliers, and determining an average magnetic field strength.

13. A device for measuring a residual magnetic field produced by an electrical cable, the device comprising:
    a magnetometer;
    a clamp for securing the magnetometer to an insulating outer layer of the cable; and
    a processor in communication with the magnetometer, wherein the processor is configured to cause the magnetometer to take a number of samples for a predetermined duration at a predetermined sample rate, and to determine the duration and the sample rate based on the frequency of the power delivered by the cable, wherein the duration and the sample rate allow for samples to be taken during a plurality of periods of the power delivered by the cable;
    wherein the magnetometer is configured to measure the residual current produced by the cable.

14. The device of claim 13, further comprising a communications module configured to communicate with an external device.

15. The device claim 13 or claim 14, wherein the processor is further configured to calculate a magnetic field strength based on the magnetic field data by multiplying the magnetic field data by a complex signal related to the frequency of the power delivered by the cable, determine a median field strength based on a set of magnetic field data, excluding outliers, and determine an average magnetic field strength.

16. A system for determining the power delivered by one or more cables, the system comprising:
    the device of claim 13; and
    a server system comprising one or more processing devices.

17. The system of claim 16, wherein the one or more processing devices within the server system are configured to perform the method comprising:
    receiving data related to a residual magnetic field produced by the cable; determining a proportionality factor relating the received data to the power delivered by comparing the residual magnetic field data to independently measured reference data related to the power delivered by the cable; and based on the proportionality factor, determining the power delivered by the cable;
    wherein the cable comprises at least two conductors.

18. The system of claim 16 or claim 17, further comprising a smart meter.

19. The system of claim 18, further comprising an energy monitoring device configured to receive data from the smart meter and to communicate with the server system.

20. The system of claim 16, wherein the server system is configured to make power data available to one or more external devices.

21. The device of claim 13, further comprising a conductive plane configured to be positioned proximate the cable and to capacitively couple with at least one conductor within the cable.

22. The device of claim 13, further comprising a high power processor configured to allow the device to control the communications module.

23. A method of determining an amplitude and a phase of power delivered by a cable, the method comprising:
    receiving data related to a residual magnetic field produced by the cable, wherein the data related to the residual magnetic field produced by the cable is temporally related to the phase of the power delivered by the cable, and wherein the cable comprises at least two conductors;
    determining a proportionality factor relating the received data to the power delivered by comparing the residual magnetic field data to independently measured reference data related to the power delivered by the cable; and
    based on the proportionality factor, determining the amplitude and the phase of power delivered by a cable.

24. The method of claim 23, further comprising temporally synchronising a software or hardware phase-locked loop implementation with the phase of a voltage potential in the cable to cause the data related to the residual magnetic field produced by the cable to be temporally related to the phase of the voltage potential in the cable.

25. The method of claim 23, further comprising waiting for a calculated phase offset of the power delivered by the cable and then causing a predetermined number of measurements to be taken during one period of the power delivered by the cable, to produce the data related to the residual magnetic field produced by the cable.

26. The method of claim 25, further comprising, after causing a predetermined number of measurements to be taken during one period of the power delivered by the cable, waiting a further half period and then causing a further predetermined number of measurements to be taken during one further period of the power delivered by the cable.

27. The method of claim 25, further comprising repeating the method of claim 25 until a predetermined number of iterations has been reached.

28. The method of claim 27, further comprising combining the measurements taken into complex measurements.

29. A method of determining power delivered by a cable, the method comprising:
    receiving data related to a residual magnetic field produced by the cable, wherein the cable comprises at least two conductors;
    receiving independently measured reference data related to the power delivered by the cable;
    integrating the data related to the residual magnetic field produced by the cable into intervals corresponding to intervals at which the independently measured reference data related to the power delivered by the cable are received;
    determining a proportionality factor relating the received data to the power delivered by comparing the residual magnetic field data to the independently measured reference data related to the power delivered by the cable; and
    based on the proportionality factor, determining the power delivered by the cable.

30. The method of claim 29, further comprising matching the intervals of data related to the residual magnetic field produced by the cable with the intervals of data related to the independently measured reference data related to the power delivered by the cable.

31. The method of claim 29 or claim 30, wherein determining a proportionality factor relating the received data to the power delivered comprises:

plotting the receiving data related to a residual magnetic field produced by the cable against the data related to independently measured reference data related to the power delivered by the cable on a Cartesian plane to produce a point cloud;

determining a line f(x)=ax+b that lies under each of the data points on the Cartesian plane; and determining the proportionality factor as the value of a.

32. The method of claim 31, further comprising:

disregarding outlying data points; and recalculating the line f(x)=ax+b that lies under each of the non-disregarded data points on the Cartesian plane.

33. The method of claim 32, further comprising, when recalculating the line f(x)=ax+b that lies under each of the non-disregarded data points on the Cartesian plane, taking into account the disregarded data points to avoid factor drift.

34. The method of claim 32, further comprising repeating the method of claim 32 until a predetermined threshold has been reached.

35. The method of claim 34, wherein the threshold is related to a total weight of the disregarded data points compared to the total weight of all of the data points in the point cloud.

36. The method of claim 34, further comprising storing the determined value of the proportionality factor for each iteration, and applying an averaging or smoothing function to the stored values of proportionality factor to determine a final proportionality factor.

37. The method of claim 29, further comprising estimating values of power flow through the cable based on known power consumption data for at least one appliance, including data related to the power consumption through the cable.

38. The method of claim 37, wherein the known power consumption data is aggregate data, being the sum of data related to power consumption through the cable and power consumption unrelated to power consumption through the cable.

39. The method of claim 37, further comprising receiving known power consumption data for the premises from a smart meter monitoring the power consumption for the premises.

40. The method of claim 39, further comprising calculating a premises power value compensated for the independently measured reference data related to the power delivered by the cable.

* * * * *